(12) United States Patent
Jhan et al.

(10) Patent No.: US 12,080,776 B2
(45) Date of Patent: Sep. 3, 2024

(54) FIELD EFFECT TRANSISTOR WITH FIN ISOLATION STRUCTURE AND METHOD

(71) Applicant: Taiwan Semiconductor Manufacturing Co., Ltd., Hsinchu (TW)

(72) Inventors: Yi-Ruei Jhan, Hsinchu (TW); Kuan-Ting Pan, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 234 days.

(21) Appl. No.: 17/463,370

(22) Filed: Aug. 31, 2021

(65) Prior Publication Data

US 2023/0060454 A1 Mar. 2, 2023

(51) Int. Cl.
*H01L 29/423* (2006.01)
*H01L 21/8234* (2006.01)
*H01L 27/088* (2006.01)
*H01L 29/06* (2006.01)
*H01L 29/417* (2006.01)
*H01L 29/66* (2006.01)
*H01L 29/78* (2006.01)

(52) U.S. Cl.
CPC .......... *H01L 29/42392* (2013.01); *H01L 21/823431* (2013.01); *H01L 21/823481* (2013.01); *H01L 27/0886* (2013.01); *H01L 29/0649* (2013.01); *H01L 29/0673* (2013.01); *H01L 29/41791* (2013.01); *H01L 29/66795* (2013.01); *H01L 29/7851* (2013.01)

(58) Field of Classification Search
CPC .......... H01L 29/42392; H01L 29/0649; H01L 29/0673; H01L 29/41791; H01L 29/66795; H01L 21/823431; H01L 21/823481; H01L 27/0886; H01L 27/088
See application file for complete search history.

(56) References Cited

U.S. PATENT DOCUMENTS

| | | |
|---|---|---|
| 9,236,267 B2 | 1/2016 | De et al. |
| 9,281,208 B2 * | 3/2016 | Kim ...................... H01L 29/785 |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,721,950 B2 * | 8/2017 | You ................... H01L 29/42364 |
| 9,786,774 B2 | 10/2017 | Colinge et al. |
| 9,853,101 B2 | 12/2017 | Peng et al. |

(Continued)

*Primary Examiner* — Dao H Nguyen
(74) *Attorney, Agent, or Firm* — Seed IP Law Group LLP

(57) ABSTRACT

A device includes a substrate and a fin isolation structure between a first gate structure and a second gate structure. The first gate structure wraps around a first vertical stack of nanostructure channels overlying a first fin. The second gate structure wraps around a second vertical stack of nanostructure channels overlying a second fin. The fin isolation structure extends from an upper surface of the first gate structure to an upper surface of the substrate. A trench isolation structure is between the first fin and the fin isolation structure, and has different etch selectivity than the fin isolation structure.

20 Claims, 20 Drawing Sheets

(56) References Cited

U.S. PATENT DOCUMENTS

| | | | |
|---|---|---|---|
| 9,881,993 B2 | 1/2018 | Ching et al. | |
| 10,510,620 B1* | 12/2019 | Chanemougame | ............................ H01L 27/0924 |
| 2019/0334014 A1* | 10/2019 | Ching | ............. H01L 21/823807 |
| 2020/0058649 A1* | 2/2020 | Ching | ............. H01L 21/823418 |
| 2020/0135849 A1* | 4/2020 | Chiang | ............. H01L 29/66439 |
| 2020/0411661 A1* | 12/2020 | Guler | ................ H01L 29/66484 |
| 2021/0408009 A1* | 12/2021 | Zheng | ................... H01L 29/775 |

* cited by examiner

FIELD EFFECT TRANSISTOR WITH FIN ISOLATION STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
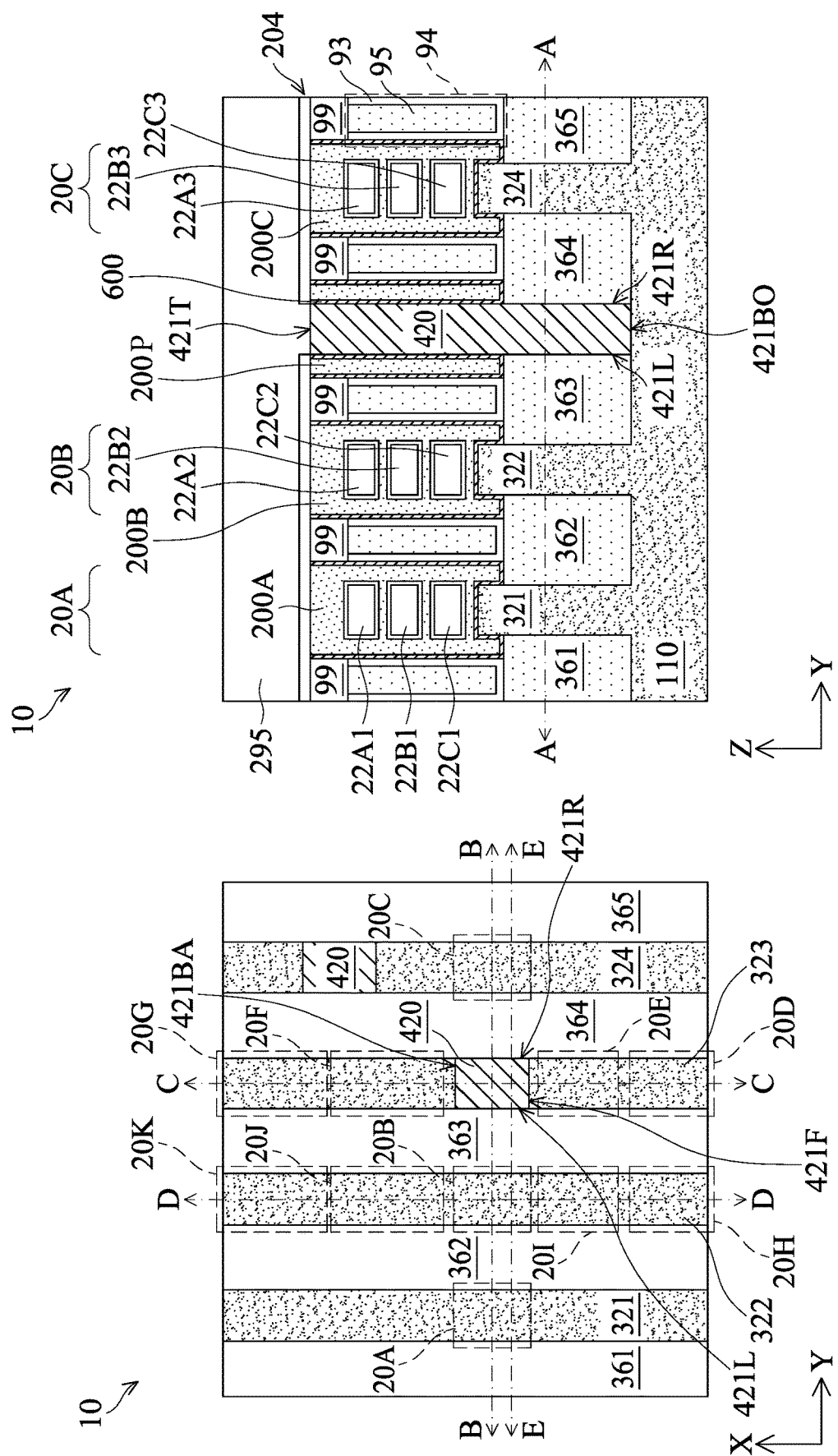
FIGS. 1A-1E are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, dimension scaling can lead to difficulties cutting fins of the semiconductor devices without damaging neighboring fins. Fin isolation structures formed by methods described herein achieve improved spacing by moving the fin cutting operation to after a shallow trench isolation (STI) formation process. Damage to neighboring fin(s) is reduced or eliminated as lateral sidewalls of the neighboring fin(s) are protected by the STI, while the fin hard mask acts as an etch stop layer protecting the neighboring fin(s) in the vertical direction. As such, spacing between fins can be reduced by as much as 10%-50%.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1C:
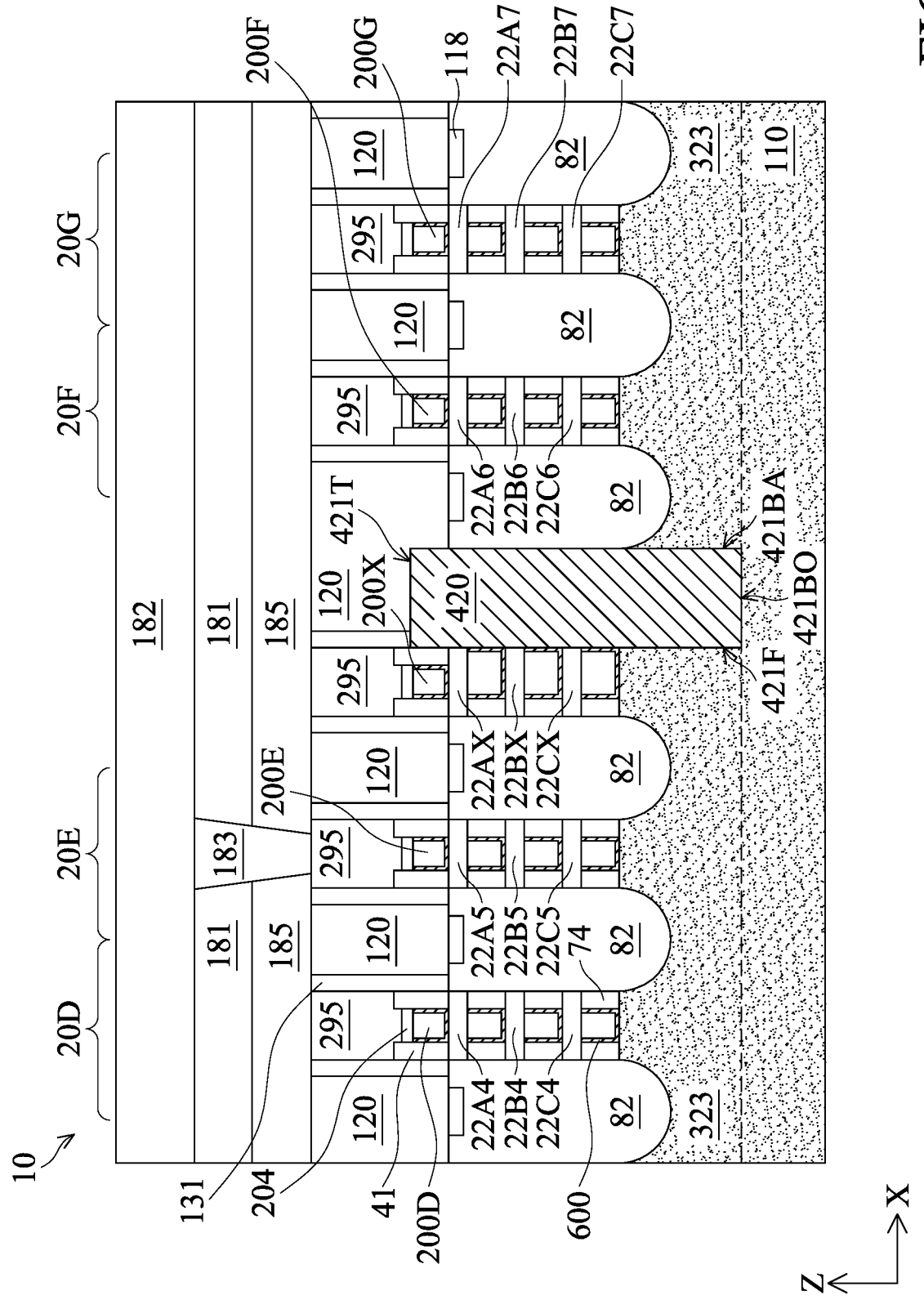
Figure 1D:
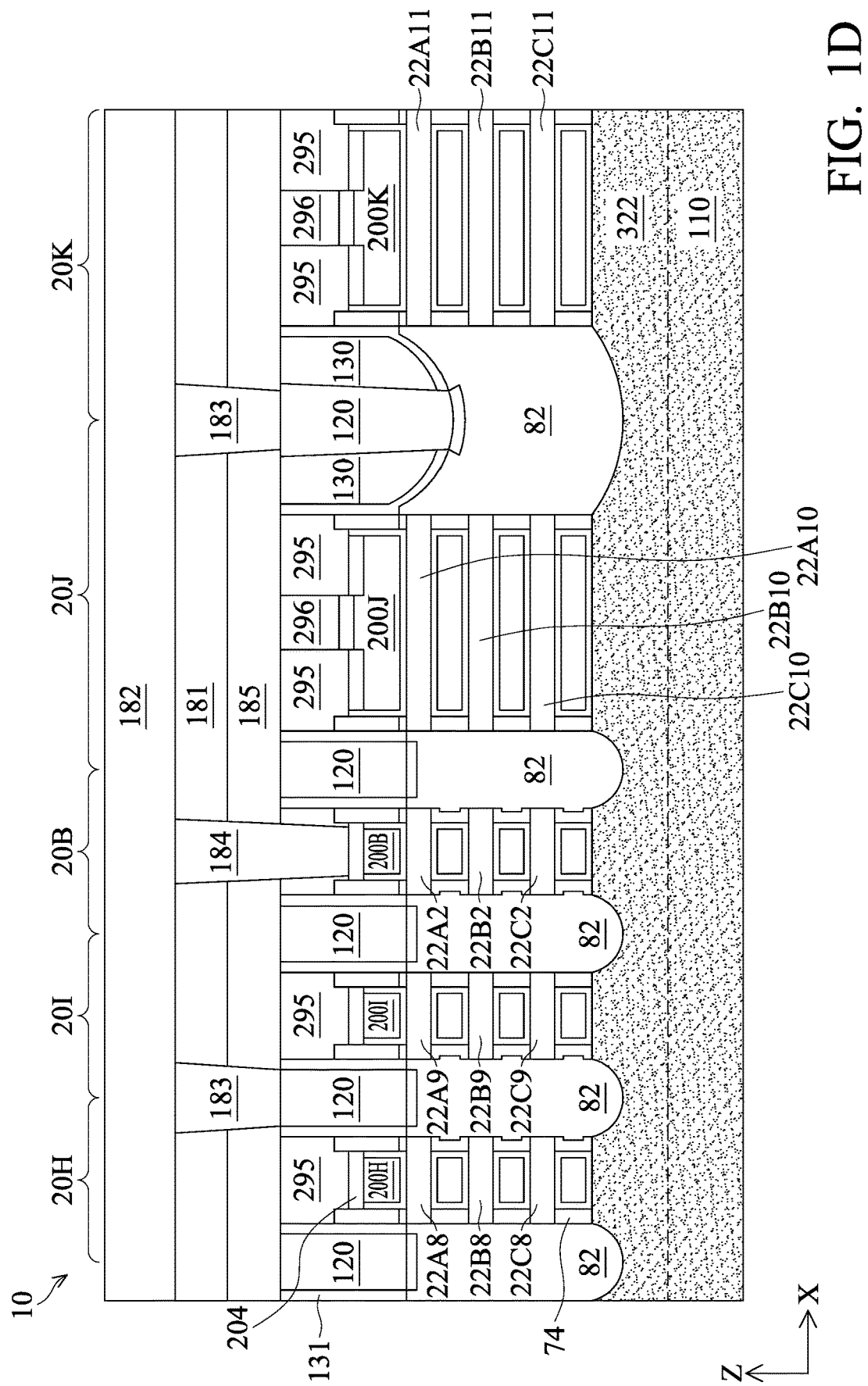
Figure 1E:
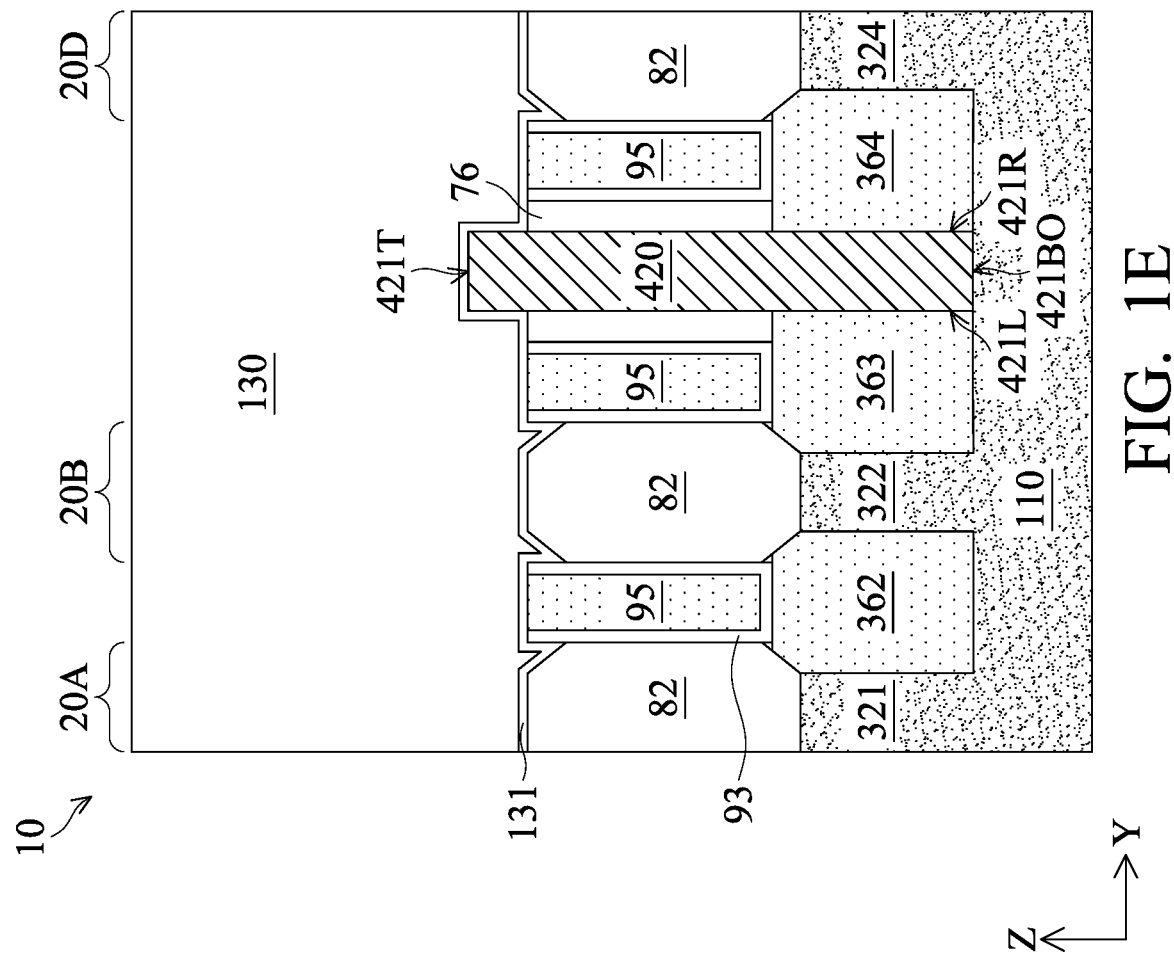

FIGS. 1A-1E illustrate diagrammatic top and cross-sectional side views of a portion of an IC device 10 fabricated according to embodiments of the present disclosure, where the IC device 10 includes gate-all-around (GAA) devices 20A-20K. FIG. 1A is a diagrammatic top view of the IC device 10 along the line A-A shown in FIG. 1B. FIG. 1B is a cross-sectional side view of a portion of the IC device 10 including the GAA devices 20A-20D along the line B-B shown in FIG. 1A. FIG. 1C is a cross-sectional side view of a portion of the IC device 10 including the GAA devices 20E-20I along the line C-C shown in FIG. 1A. FIG. 1D is a cross-sectional side view of a portion of the IC device 10 including the GAA devices 20J-20K along the line D-D shown in FIG. 1A. FIG. 1E is a cross-sectional side view of a portion of the IC device 10 including the GAA devices 20A-20D along the line E-E shown in FIG. 1A. Certain features may be removed from view intentionally in the various views of FIGS. 1A-1E for simplicity of illustration.

The GAA devices 20A-20K are formed on fins 321-324, and include nanosheet channels 22A1-22C11, source/drain regions 82, and gate structures 200A-200K. The nanosheet channels 22A1-22C11 are arranged in vertical stacks over the fins 321-324, are abutted on opposite sides by the source/drain regions 82 (see FIGS. 1D, 1E), and are covered and surrounded by the gate structures 200A-200K. As shown in FIG. 1A and FIG. 18, one or more of the fins 321-324 may be "cut" by replacing a portion of the fin 321-324 with a fin isolation structure 420. Cutting the fins 321-324 may aid in isolating functional circuitry, such as individual SRAM cells. In the example illustrated in FIGS. 1A-1E, the fin 323 and the fin 324 are cut by the fin isolation structures 420. Placement of the cuts along the X-axis direction may be staggered, as shown. In some embodiments, the fin isolation structures 420 are partially or fully aligned in their position on the X-axis. The fin isolation structures 420 are generally non-conductive. In some embodiments, the fin isolation structures 420 are formed of a dielectric material, such as SiOCN or other appropriate material. In some embodiments, as shown in FIG. 1B, a lower portion of the fin isolation structure 420 is in contact with isolation structures 363, 364, and an upper portion of the fin isolation structure 420 is in contact with gate structure portions 200P on either side of the fin isolation structure 420.

The GAA devices 20A-20K may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

Referring to FIG. 1A and FIG. 1B, the GAA devices 20A-20C are formed over and/or in a substrate 110, and generally include gate structures 200A-200C straddling and/or wrapping around semiconductor channels, alternately referred to as "nanostructures," located over semiconductor fins 321-324 protruding from, and separated by, isolation structures 361-365 (or "isolation features" or "isolation regions"). The channels are labeled "22AI" to "22CI," where "I" is an integer from 1 to 11, corresponding to the transistors 20A-20K, respectively. Each gate structure 200A-200K controls current flow through the channels 22A1-22C11. The GAA devices 20D-20K illustrated in FIGS. 1C, 1D have similar structure to the GAA devices 20A-20C. In the following, one or more of the GAA devices 20A-20K (e.g., the GAA device 20D) may be described as an example, and the related description is similarly valid for others of the GAA devices 20A-20K (e.g., the GAA devices 20A-20C, 20E-20K).

Referring to FIG. 1C, the cross-sectional view of the IC device 10 in FIG. 1C is taken along an X-Z plane, where the X-axis direction is the horizontal direction, and the Z-axis direction is the vertical direction. The cross-sectional view in FIG. 1C shows GAA devices 20D-20G of the GAA devices 20A-20K, and the related description is generally applicable to the other GAA devices 20A-20C, 20H-20K. In FIG. 1C, taking the GAA device 20D as an example, the GAA device 20D is shown including three channels 22A4-22C4, which are laterally abutted by source/drain features 82, and covered and surrounded by the gate structure 200D. Generally, the number of channels 22 is not limited to three, and may be in a range from 2 to 8 (or more). The gate structure 200D controls flow of electrical current through the channels 22A4-22C4 to and from the source/drain features 82 based on voltages applied at the gate structure 200D and at the source/drain features 82.

In some embodiments, the fin structure 323 shown in FIG. 1C includes silicon. In some embodiments, the GAA device 20D is an NFET, and the source/drain features 82 thereof include silicon phosphorous (SiP). In some embodiments, the GAA device 20D is a PFET, and the source/drain features 82 thereof include silicon germanium (SiGe). Generally, the source/drain features 82 include appropriate epitaxially grown semiconductor materials with or without suitable dopants implanted in situ or in a separate process.

The channels 22A4-22C4 of the GAA device 20D each include a semiconductive material, for example silicon or a silicon compound, such as silicon germanium, or the like. The channels 22A4-22C4 are nanostructures (e.g., having sizes that are in a range of a few nanometers) and may also each have an elongated shape and extend in the X-direction. In some embodiments, the channels 22A4-22C4 each have a nano-wire (NW) shape, a nano-sheet (NS) shape, a nano-tube (NT) shape, or other suitable nanoscale shape. The cross-sectional profile of the channels 22A4-22C4 may be rectangular, round, square, circular, elliptical, hexagonal, or combinations thereof.

In some embodiments, the lengths (e.g., measured in the X-direction) of the channels 22A4-22C4 may be different from each other, for example due to tapering during a fin etching process. In some embodiments, length of the channel 22A4 may be less than a length of the channel 22B4, which may be less than a length of the channel 22C4. The channels 22A4-22C4 each may not have uniform thickness, for example due to a channel trimming process used to expand spacing (e.g., measured in the Z-direction) between the channels 22A4-22C4 to increase gate structure fabrication process window. For example, a middle portion of each of the channels 22A4-22C4 may be thinner than the two ends of each of the channels 22A4-22C4. Such shape may be collectively referred to as a "dog-bone" shape.

In some embodiments, the spacing between the channels 22A4-22C4 (e.g., between the channel 22B4 and the channel 22A4 or the channel 22C4) is in a range between about 8 nanometers (nm) and about 12 nm. In some embodiments, a thickness (e.g., measured in the Z-direction) of each of the channels 22A4-22C4 is in a range between about 5 nm and about 8 nm. In some embodiments, a width (e.g., measured in the Y-direction, not shown in FIG. 1C, orthogonal to the X-Z plane) of each of the channels 22A4-22C4 is at least about 8 nm.

Figure 14:
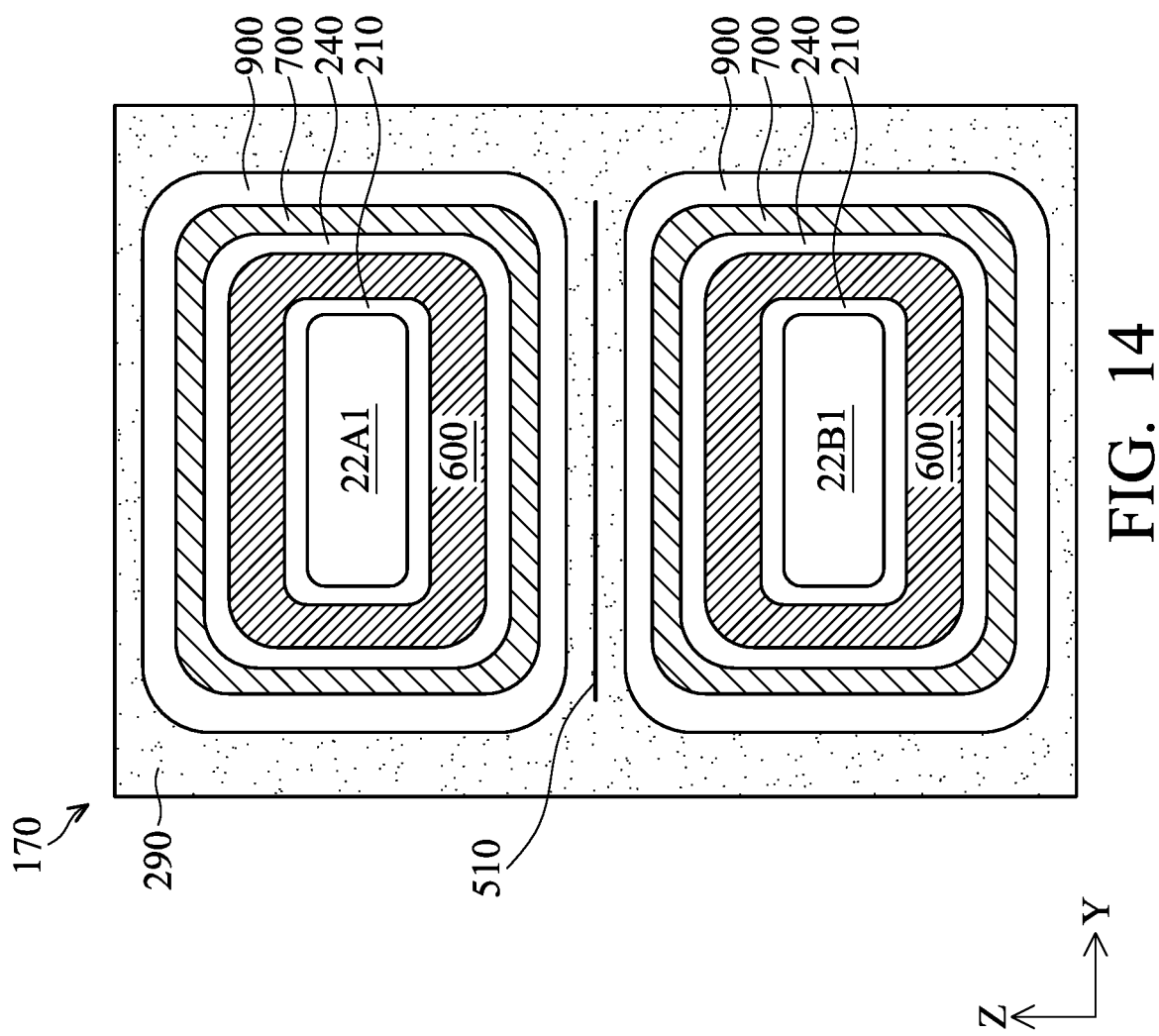
FIG. 14 is a view of a portion of a gate structure in accordance with various embodiments.

The gate structure 200D is disposed over and between the channels 22A4-22C4, respectively. In some embodiments, the gate structure 200D is disposed over and between the channels 22A4-22C4, which are silicon channels for N-type devices or silicon germanium channels for P-type devices. In some embodiments, as shown in FIG. 14, the gate structure 200D includes an interfacial layer (IL) 210, one or more gate dielectric layers 600, one or more work function tuning layers 900, and a metal fill layer 290.

The interfacial layer 210, which may be an oxide of the material of the channels 22A4-22C4, is formed on exposed areas of the channels 22A4-22C4 and the top surface of the fin 323. The interfacial layer 210 promotes adhesion of the gate dielectric layers 600 to the channels 22A4-22C4. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k=3.9). Exemplary high-k dielectric materials include $HfO_2$, HfSiO, HfSiON, HfTaO, HfTIO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, TiOz, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200D further includes one or more work function metal layers, represented collectively as work function metal layer 900. When configured as an NFET, the work function metal layer 900 of the GAA device 20D may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MON, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200D also includes metal fill layer 290. The metal fill layer 290 may include a conductive material such as tungsten, cobalt, ruthenium, iridium, molybdenum, copper, aluminum, or combinations thereof. Between the channels 22A4-22C4, the metal fill layer 290 is circumferentially surrounded (in the cross-sectional view) by the one or more work function metal layers 900, which are then circumferentially surrounded by the gate dielectric layers 600. The gate structure 200D may also include a glue layer that is formed between the one or more work function layers 900 and the metal fill layer 290 to increase adhesion.

Further to FIG. 1C, the GAA devices 20D-20G include gate spacers 41 and inner spacers 74 that are disposed on sidewalls of the gate dielectric layer 600 and the IL 210. The inner spacers 74 are also disposed between the channels 22A4-22C4. The gate spacers 41 and the inner spacers 74 may include a dielectric material, for example a low-k material such as SiOCN, SiON, SiN, or SiOC. In some embodiments, one or more additional spacer layers are present abutting the gate spacers 41.

The GAA devices 20D-20G may further include source/drain contacts 120 that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may include one or more of nickel, cobalt, titanium, tantalum, platinum, tungsten, other noble metals, other refractory metals, rare earth metals or their alloys. In some embodiments, thickness of the silicide layer 118 (in the Z direction) is in a range of about 0.5 nm to about 5 nm. In some embodiments, height of the source/drain contacts 120 may be in a range of about 1 nm to about 50 nm.

In FIG. 1E, in some embodiments, each of the source/drain regions 82 is formed over a respective fin 321, 322, 324, and is separated from others of the source/drain regions 82 by hybrid fins 94 (or "inactive fins 94") formed over isolation structures 361-365. In some embodiments, the isolation structures 361-364 are trench isolation structures, such as shallow trench isolation ("STI") regions. In some embodiments, each of the hybrid fins 94 includes a liner layer 93 (or "dielectric layer 93") and a fill layer 95 (or "oxide layer 95").

In FIG. 1D, certain of the GAA devices, such as the GAA devices 20I, 20K, further include an interlayer dielectric (ILD) 130. The ILD 130 provides electrical isolation between the various components of the GAA devices 20J, 20K discussed above, for example between the gate structures 200J, 200K and the source/drain contact 120 therebetween. The etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, $HfO_2$, $ZrO_2$, ZrAlOx, HfAlOx, HfSiOx, $Al_2O_3$, or other suitable material. In some embodiments, thickness of the etch stop layer 131 is in a range of about 1 nm to about 5 nm.

In some embodiments, a protective layer 204 and a capping layer 295 overlie the gate structures 200H-200K. The capping layer 295, also referred to as a "self-aligned capping" (SAC) layer, may provide protection to the underlying gate structures 200H-200K, and may also act as a CMP stop layer when planarizing the source/drain contacts 120 following formation thereof. The capping layer 295 may be a dielectric layer including a dielectric material, such as SiO2, SiN, SiCN, SiC, SiOC, SiOCN, $HfO_2$, $ZrO_2$, ZrAlOx, HfAlOx, HfSiOx, $Al_2O_3$, BN, or other suitable dielectric material. The protective layer 204 may be or include a dielectric material different from that of the capping layer 295, such as $SiO_2$, SiN, SiCN, SiC, SiOC, SiOCN, $HfO_2$, $ZrO_2$, ZrAlOx, HfAlOx, HfSiOx, $Al_2O_3$, BN, or other suitable dielectric material. In some embodiments, thickness of the protective layer 204 may be in a range of about 1 nm to about 10 nm. In some embodiments, the protective layer 204 is a part of the gate structures 200H-200K. As shown in FIG. 1D, the capping layer 295 may be split by a support structure 296 over gate structures 220J, 200K corresponding to longer channels 22A10-22C11. In some embodiments, the support structures 296 are formed of a dielectric material, which may be different from the material of the capping layer 295.

FIGS. 1A, 1B, 1C, 1E illustrate views of the fin isolation structures 420 in the XY plane, the XZ plane and the YZ plane cut through the fins 321-324 (FIG. 1A), cut along the fin 323 (FIG. 1C) or across the fins 321-324 (FIGS. 1B, 1E). FIG. 1B illustrates a cut through the gate structures 200A-200C and the channels 22A1-22C3, and FIG. 1E illustrates a cut through source/drain regions 82 abutting the channels 22A1-22C3. The fin isolation structure 420 shown in FIGS. 1B, 1C, 1E is embedded in the semiconductor fin 323. In some embodiments, the fin isolation structure 420 has roughly the shape of a rectangular prism, trapezoidal prism, or the like. FIGS. 1A-1C, 1E illustrate the fin structure 420 having substantially vertical sidewalls 421L, 421R, 421F, 421BA and substantially horizontal upper and lower surfaces 421T, 421B. A left sidewall 421L is opposite a right sidewall 421R, each extending along the X-axis direction and the Z-axis direction, and facing outward in either the positive or negative Y-axis direction. A front sidewall 421F is opposite a back sidewall 421BA, each extending along the Y-axis direction and the Z-axis direction, and facing outward in either the positive or negative Y-axis direction. A top surface 421T is opposite a bottom surface 421B, each extending along the X-axis and Y-axis directions, and facing outward in either the positive or negative Z-axis direction.

As shown in the YZ plane view illustrated in FIG. 1B, between the gate structures 200B, 200C, an upper portion of the fin isolation structure 420 is abutted by materials deposited while forming the gate structures 200A-200C, and a lower portion of the fin isolation structure 420 is abutted by the isolation structures 363, 364. The fin isolation structure 420 is or includes different material composition than that of the isolation structures 363, 364. As such, visible interfaces may be present between the fin isolation structure and the isolation structures 363, 364. In some embodiments, the left sidewall 421L is in contact with the isolation structure 363 and the gate dielectric layer 600. The right sidewall 421R may be in contact with the isolation structure 364 and the gate dielectric layer 600. The bottom surface 421BO may be in contact with the substrate 110. The top surface 421T may be in contact with a portion of the capping layer 295 that extends through a break in the protective layer 204. As shown in FIG. 1E, the left and right sidewalls 421L, 421R may be in contact with spacer portions 76 formed during deposition of the inner spacers 74 (see FIG. 10), and the top surface 421T may be in contact with the CESL 131 or the ILD 130 in embodiments in which the CESL 131 is not present.

As shown in the XZ plane view illustrated in FIG. 1C, the top surface 421T may be in contact with the source/drain contact 120 and the CESL 131. In some embodiments, the top surface 421T is at a level above the upper surface of the source/drain region 82. As such, the source/drain contact 120 may have a step down from the top surface 421T to the upper surface of the source/drain region 82. The level of the top surface 421T may be substantially the same as that of upper surfaces of the gate structures 200. The front surface 421F may be in contact with channels 22AX-22CX and gate structure 200X. The channels 22AX-22CX may be inactive due to presence of the fin isolation structure 420 abutting end portions of the channels 22AX-22CX instead of a source/drain region. As such, the channels 22AX-22CX are abutted on first end portions by the source/drain region 82, and are abutted on second end portions by the fin isolation structure 420. In some embodiments, the gate structure 200X is inactive. The gate structure 200X may be inactive due to the channels 22AX-22CX being inactive. In some embodiments, the gate structure 200X is in contact with the inner spacers 74 on a first side, and is in contact with the front side 421F of the fin isolation structure 420 on a second side opposite the first side. The front side 421F and the back side 421BA of the fin isolation structure 420 are in contact with the fin 323. The back side 421BA may be in contact with the source/drain region 82. In some embodiments, the back side 421BA may be in contact with the silicide 118.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 15:
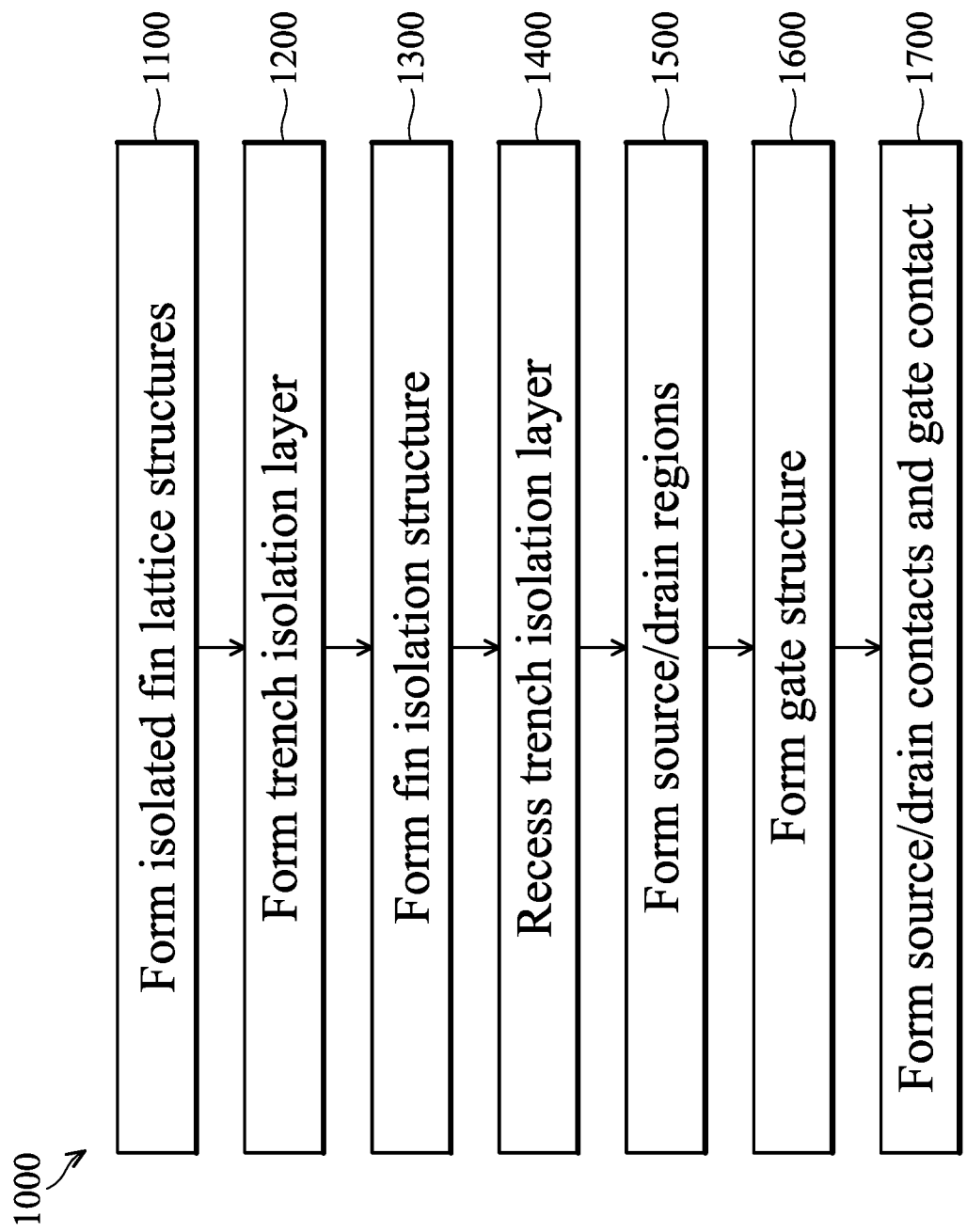
FIG. 15 is a flowchart illustrating a method of fabricating a semiconductor device according to various aspects of the present disclosure.

FIG. 15 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-14, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2 through 14 are perspective views and cross-sectional views of intermediate stages in the manufacturing of nano-FETs, in accordance with some embodiments. FIGS. 4A-4F illustrate perspective views. FIGS. 2, 3 and 5-14 illustrate cross-sectional or perspective side views, with certain features omitted for ease of illustration.

Figure 2:
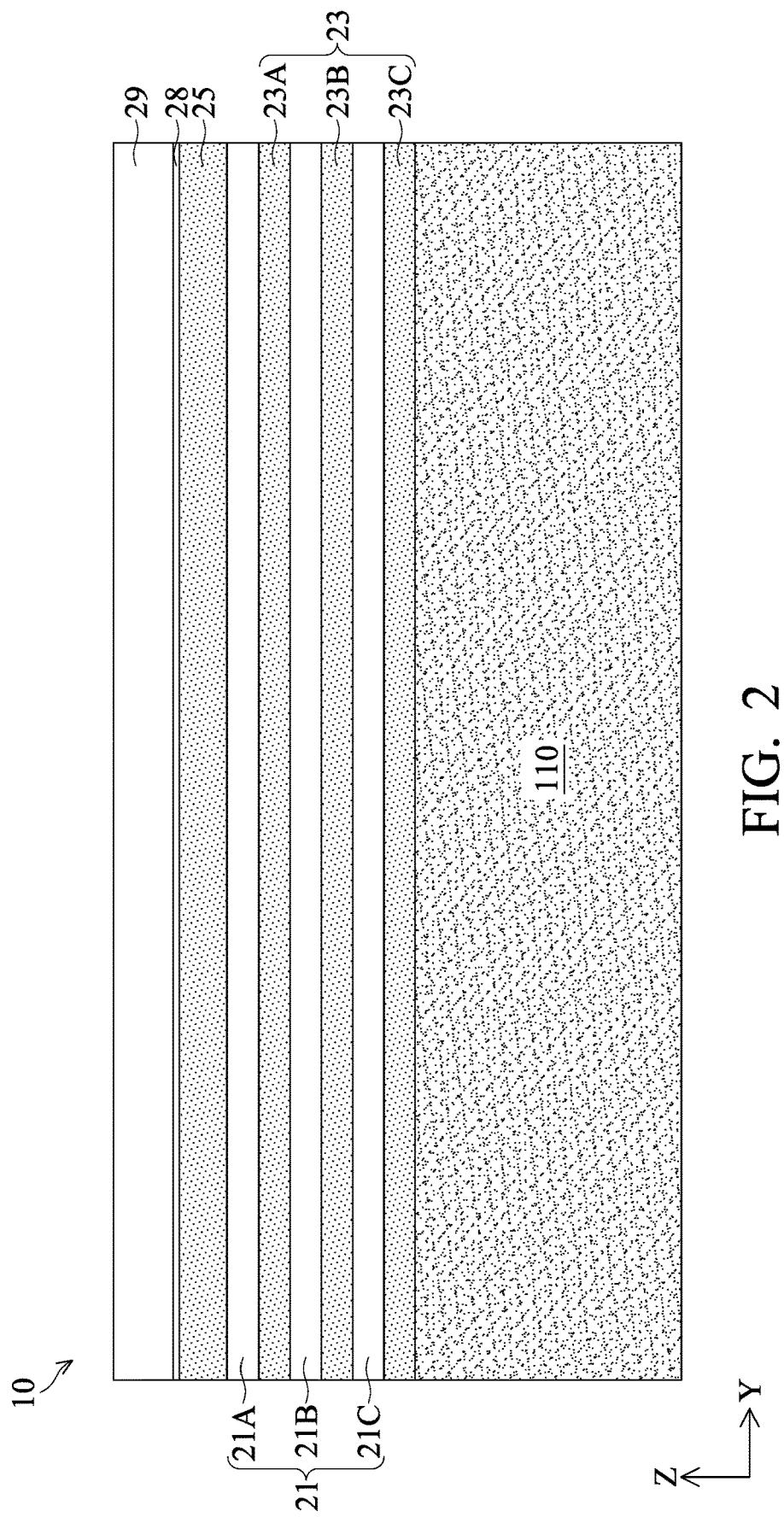
FIGS. 2 and 3 are views of forming stacks of nanostructures in accordance with various embodiments.

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2, a multi-layer stack or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack may include one or two each or four or more each of the first semiconductor layers 21 and the second semiconductor layers 23. Although the multi-layer stack is illustrated as including a second semiconductor layer 23C as the bottommost layer, in some embodiments, the bottommost layer of the multi-layer stack may be a first semiconductor layer 21 (e.g., the first semiconductor layer 21C). In some embodiments, an additional second semiconductor layer 25 is formed over the uppermost first semiconductor layer 21A, as shown.

Due to high etch selectivity between the first semiconductor materials and the second semiconductor materials, the second semiconductor layers 23, 25 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 2, an oxide layer 28 may be formed over the second semiconductor layer 25. Following formation of the oxide layer 28, a hard mask layer 29 may be formed covering the oxide layer 28. The hard mask layer 29 may include silicon nitride or another suitable material.

Figure 3:
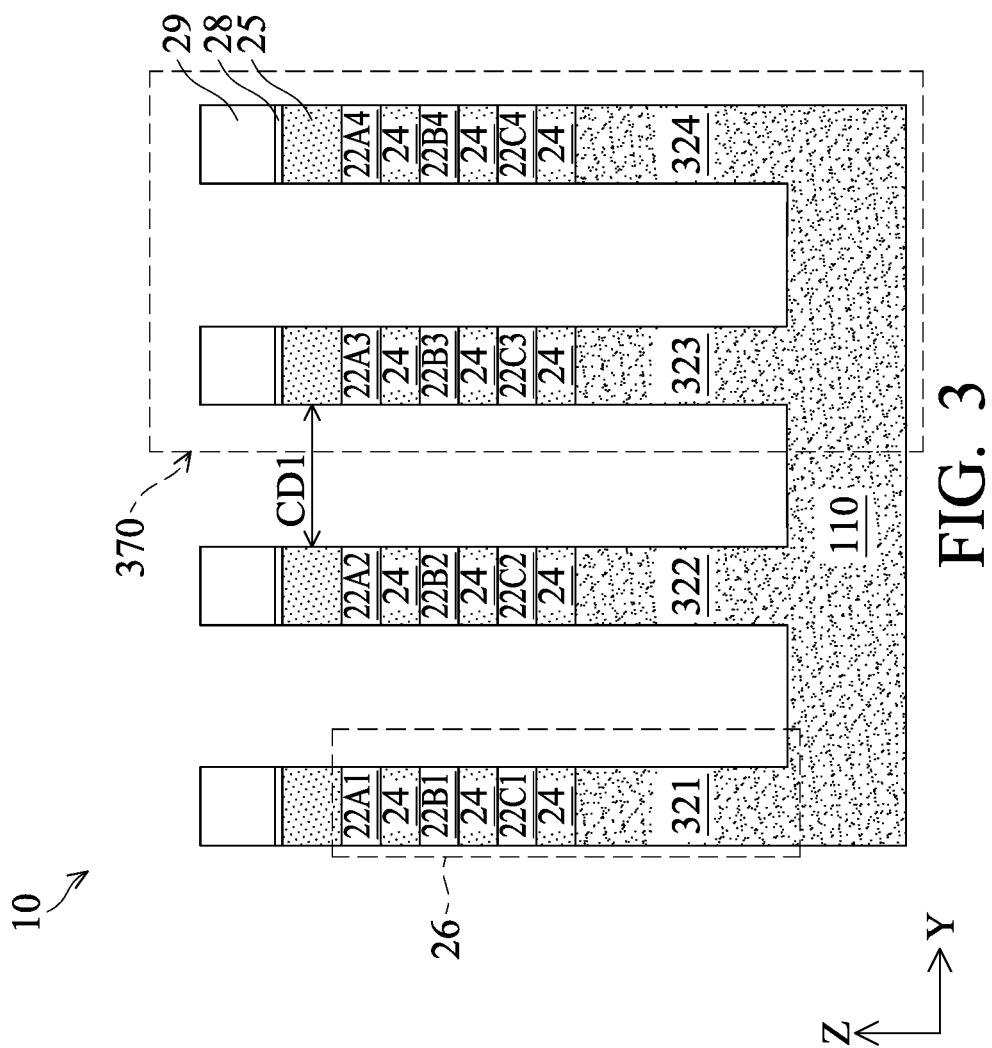

In FIG. 3, fins 321-324 are formed in the substrate 110 and nanostructures 22, 24 are formed in the multi-layer stack corresponding to act 1100 of FIG. 15. In some embodiments, vertical stacks 26 including the nanostructures 22, 24 and the fins 321-324 may be formed by etching trenches in the multi-layer stack and the substrate 110. The etching may be any acceptable etch process, such as a reactive ion etch (RIE), neutral beam etch (NBE), the like, or a combination thereof. The etching may be anisotropic. First nanostructures 22A1-22C4 (also referred to as "channels" below) are formed from the first semiconductor layers 21, and second nanostructures 24 are formed from the second semiconductor layers 23. Distance CD1 between the fins 321-324 (e.g., the fins 322, 323) and nanostructures 22, 24 (e.g., the nanostructures 22A2-22C2, 22A3-22C3) may be from about 18 nm to about 100 nm.

In FIG. 3, the nanostructures 22A1-22C4 extend continuously (e.g., are uncut) in the X-axis direction. The nanostructures 22A1-22C4 are cut in two subsequent processes described with reference to FIGS. 4A-4F (fin isolation cut) and FIG. 9 (pre-S/D cut). The nanostructures 22A1-22C4 that are cut are labeled (e.g., in FIGS. 18-1D) as "22A1-22C11" to differentiate between the GAA devices 20A-20K. For ease of illustration, the nanostructures 22 overlying the fin 323 are labeled in FIGS. 3-8 as 22A3-22C3, and the nanostructures 22 overlying the fin 324 are labeled as 22A4-22C4. Following the cut in FIG. 9, the nanostructures 22 overlying the fin 324 are relabeled "22A3-22C3" in FIGS. 10 and 13 to maintain consistency with FIGS. 18-1D.

The fins 321-324 and the nanostructures 22, 24 may be patterned by any suitable method. For example, one or more photolithography processes, including double-patterning or multi-patterning processes, may be used to form the fins 321-324 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321-324.

FIG. 3 illustrates the fins 321-324 having vertical sidewalls. In some embodiments, the fins 321-324 have tapered sidewalls, such that a width of each of the fins 321-324 and/or the nanostructures 22, 24 continuously increases in a direction towards the substrate 110. In such embodiments, each of the nanostructures 22, 24 may have a different width and be trapezoidal in shape. When the sidewalls are substantially vertical (non-tapered), as shown in FIG. 3, width of the fins 321-324 and the nanostructures 22, 24 is substantially similar, and each of the nanostructures 22, 24 is rectangular in shape.

FIGS. 2, 3 illustrate one embodiment (e.g., etch last) of forming the fins 321-324 and the nanostructures 22, 24. In some embodiments, the fins 321-324 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3, appropriate wells (not separately illustrated) may be formed in the fins 321-324, the nanostructures 22, 24. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 321-324 and the nanostructures 22, 24 may obviate separate implantations, although in situ and implantation doping may be used together.

Figure 4A:
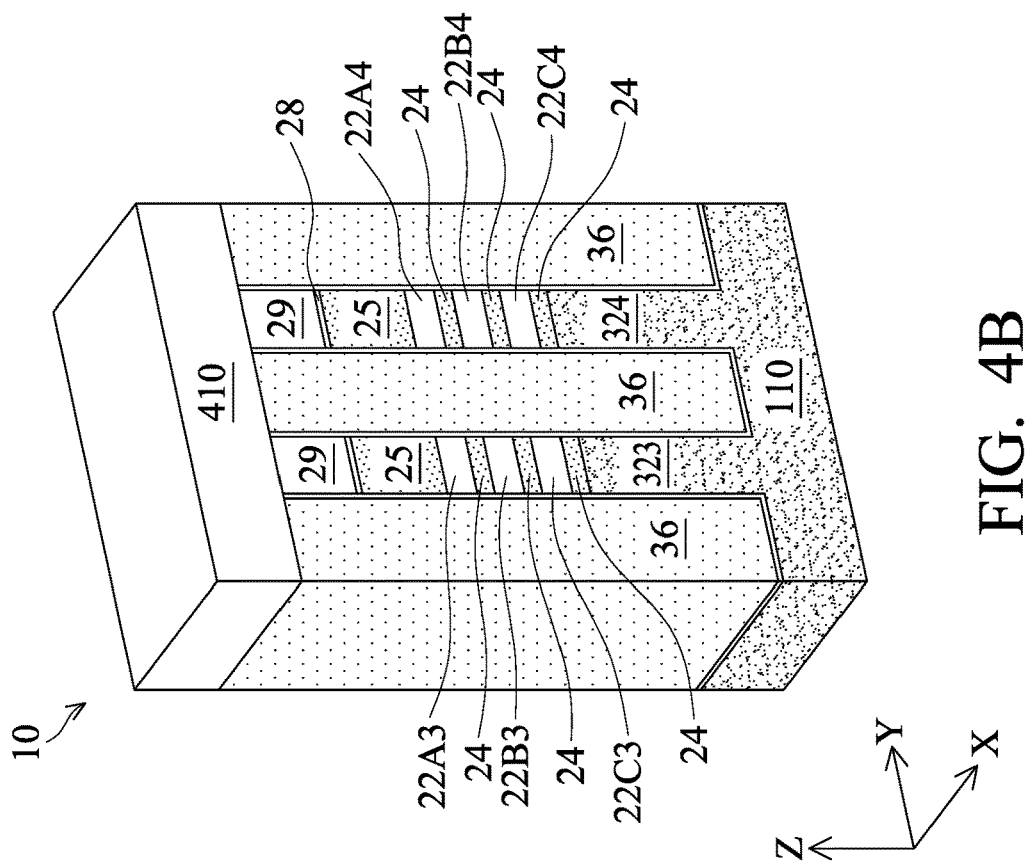
FIG. 4A is a view of forming an layer of insulation material in accordance with various embodiments.

FIGS. 4A-4F are perspective views of a portion 370 of the device 10 highlighted in phantom in FIG. 3. In FIGS. 4A-4F, isolation structures 363-365, which may be shallow trench isolation (STI) regions, are formed adjacent the fins 323, 324. In FIG. 4A, an insulation material 36 is deposited over the substrate 110, the fins 321-324, and nanostructures 22, 24, and between adjacent fins 321-324 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 321-324, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the hard mask layer 29. Top surfaces of the hard mask layer 29 may be exposed and level with the insulation material after the removal process is complete.

Figure 4B:
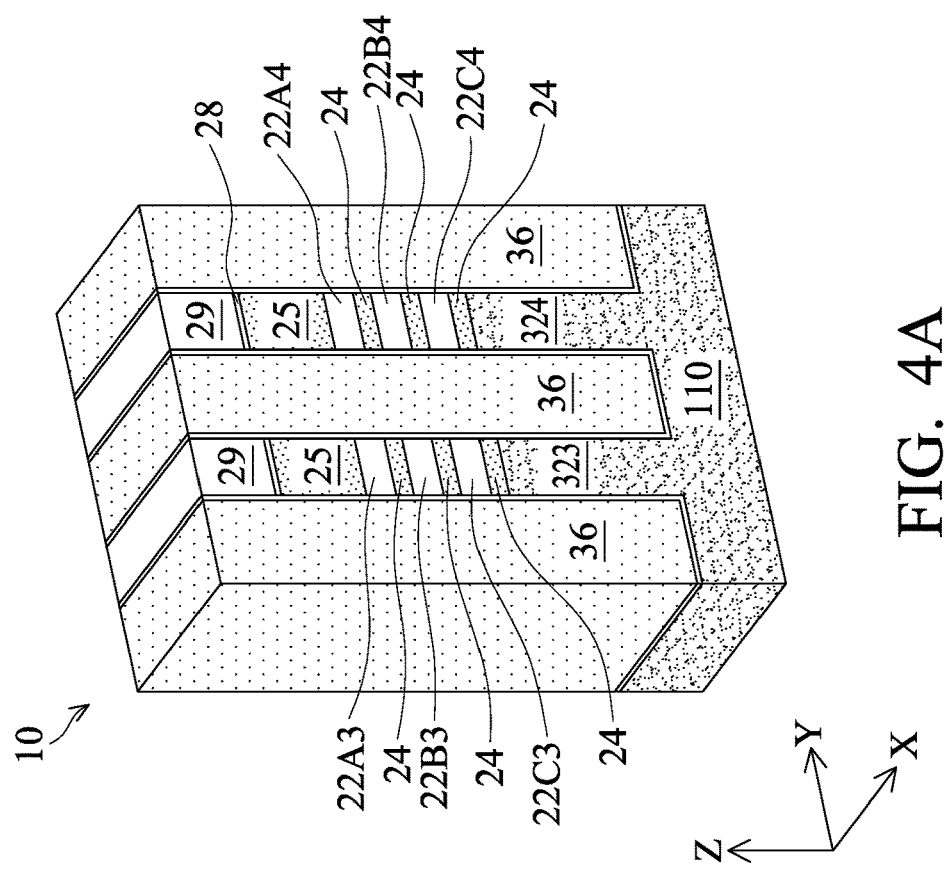
FIG. 4B is a view of forming a mask layer in accordance with various embodiments.

In FIG. 4B, a mask layer 410 is formed covering the insulation material 36. In some embodiments, the mask layer 410 is a hard mask layer, which may be or comprise a dielectric material having different etch selectivity than the hard mask layer 29 and the insulation material 36. The mask layer 410 may be formed to a uniform thickness over the hard mask layer 29 and the insulation material 36 by any appropriate process, such as CVD, ALD or the like.

Figure 4C:
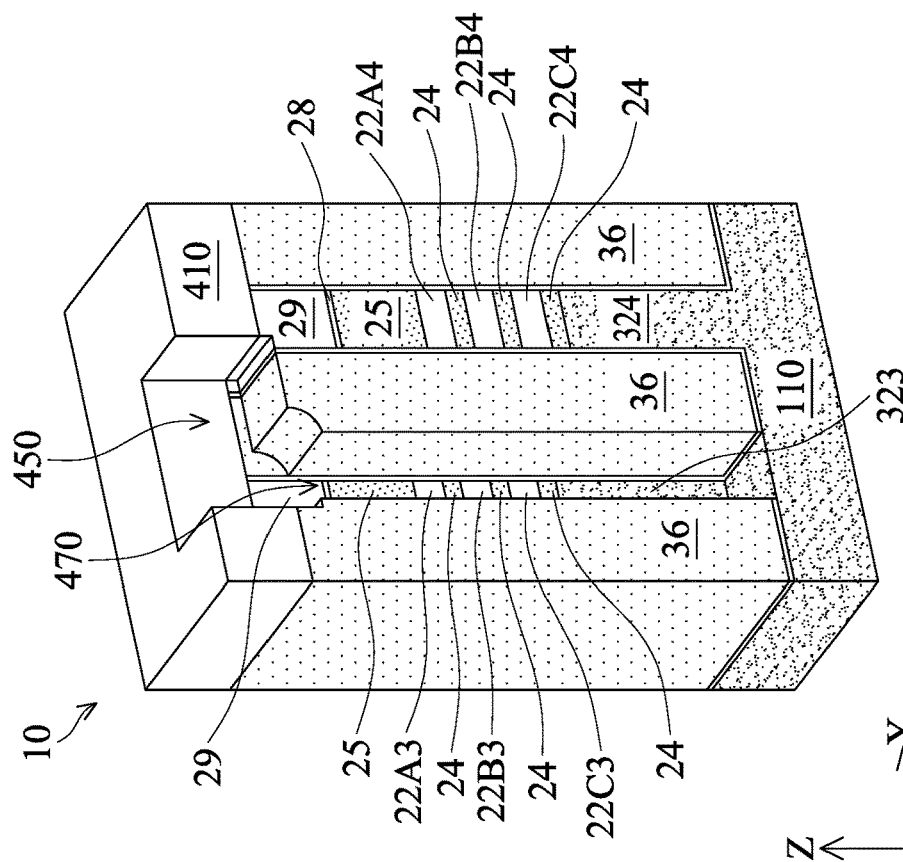
FIG. 4C is a view of patterning the mask layer in accordance with various embodiments.

In FIG. 4C, the mask layer 410 is patterned to form an opening 450, as shown. In some embodiments, the mask layer 410 is patterned by depositing a photoresist layer and an optional anti-reflective coating, exposing the photoresist layer to deep ultraviolet (DUV) or extreme ultraviolet (EUV) light, removing exposed or unexposed portions of the photoresist layer to expose the mask layer 410, and etching the exposed portions of the mask layer 410. As shown in FIG. 4C, the opening 450 is formed to expose the fin 323 and structures overlying the fin 323, such as the nanostructures 22A3-22C3, 24, the oxide layer 28 and the hard mask layer 29. The etching of the mask layer 410 that forms the opening 450 may stop on the hard mask layer 29 and the insulation material 36. Generally, the opening 450 is slightly wider (e.g., in the Y-axis direction) than the fin 323 to ensure complete removal of the fin 323 and the overlying structures in a subsequent operation. As such, in addition to exposing the fin 323 and the overlying structures, the opening 450 further exposes portions of the neighboring insulation material 36 on either side of the fin 323. Exposure of the neighboring fin 324 and overlying structures thereof may also, as shown, due to undesirable overlay shift during exposure of the photoresist layer. Presence of the hard mask layer 29 and the insulation material 36 protects the fin 324, the nanostructures 22A4-22C4, 24, 25 and the oxide layer 28 during removal of the fin 323 and its overlying structures, as will be described below.

Figure 4D:
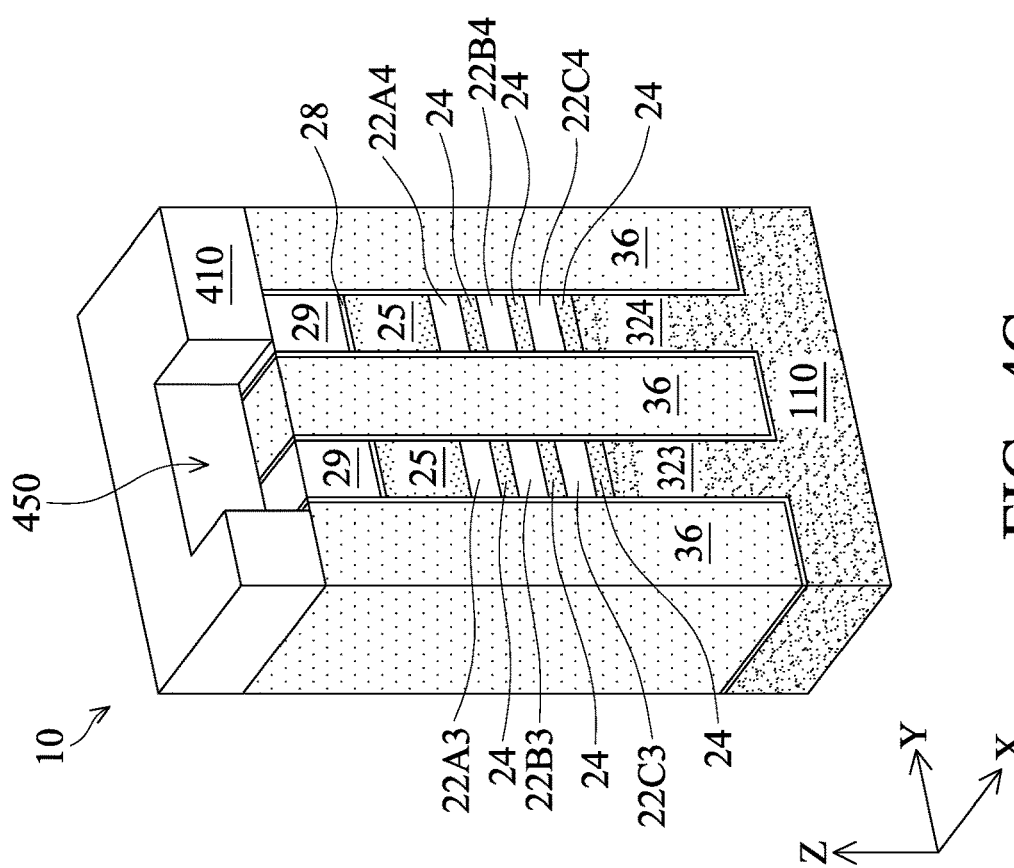
FIG. 4D is a view of removing a portion of a fin and overlying nanostructures in accordance with various embodiments.

In FIG. 4D, the exposed portions of the hard mask layer 29, the oxide layer 28 and the nanostructures 22A2-22C2, 24, 25 overlying the fin 323, and the fin 323 itself, are removed by one or more etching processes, forming a second opening 470. A first etching process may remove the exposed portions of the hard mask layer 29. Following removal of the hard mask layer 29, a second etching process may remove the oxide layer 28. In some embodiments, material of the oxide layer 28 may be an oxide of SiGe, and material of the neighboring insulation material 36 may be an oxide of Si, such that the second etching process only attacks the oxide layer 28 while leaving the insulation material 36 substantially intact. Following removal of the oxide layer 28, alternating third and fourth etching processes may be performed that remove the nanostructures 24, 25 and the nanostructures 22A3-22C3. The exposed portion of the fin 323 may then be removed by a fifth etching process that recesses the fin 323 to a level substantially level with the bottom surfaces of the insulation material 36. In some embodiments, the fifth etching process terminates at the substrate 110. In some embodiments, the fifth etching process continues a short depth into the substrate 110, e.g., below the level of the bottom surfaces of the insulation material 36.

As shown in FIG. 4D, one or more of the first to fifth etching processes may attack the neighboring insulation material 36 or the neighboring hard mask layer 29 overlying the fin 324. Generally, due to different etch selectivity of the insulation material 36 (e.g., silicon oxide) and the hard mask layer 29 (e.g., SiN) relative to the first and second semiconductor materials (e.g., Si and SiGe) that make up the nanostructures 22A3-22C3, 24, 25 and the fin 323, the combination of the insulation material 36 and the hard mask layer 29 is sufficient to avoid etching into the nanostructures 22A4-22C4, 24, 25 overlying the fin 324 by the first to fifth etching processes.

Figure 4F:
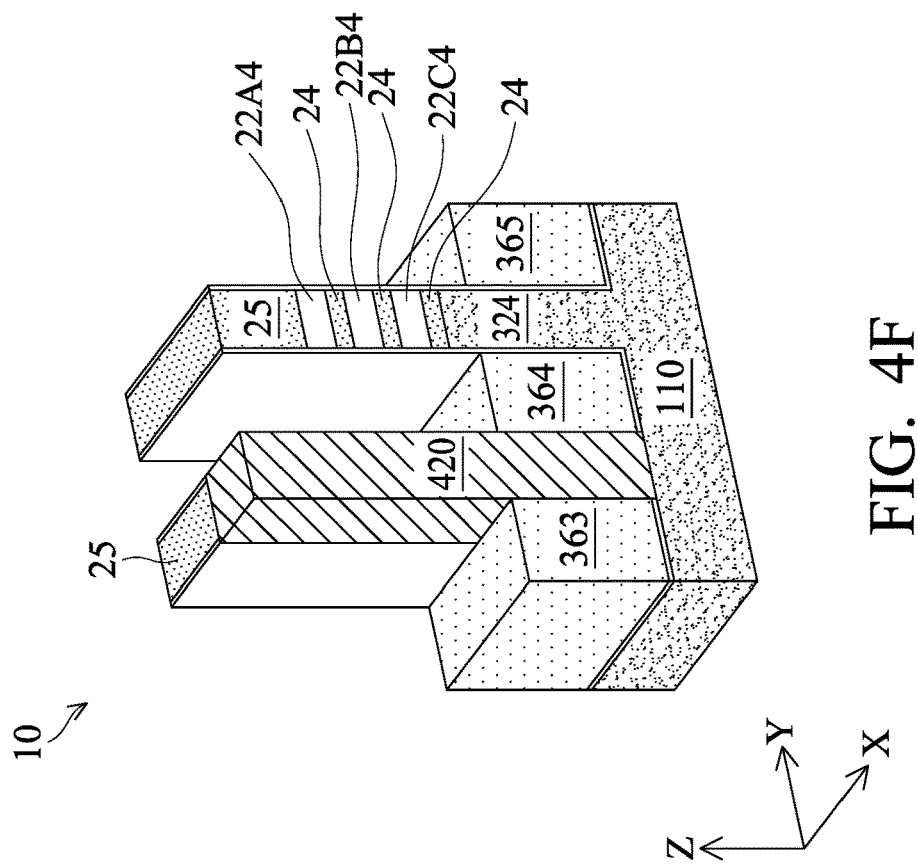
FIG. 4F is a view of recessing the layer of insulation material in accordance with various embodiments.
Figure 4E:
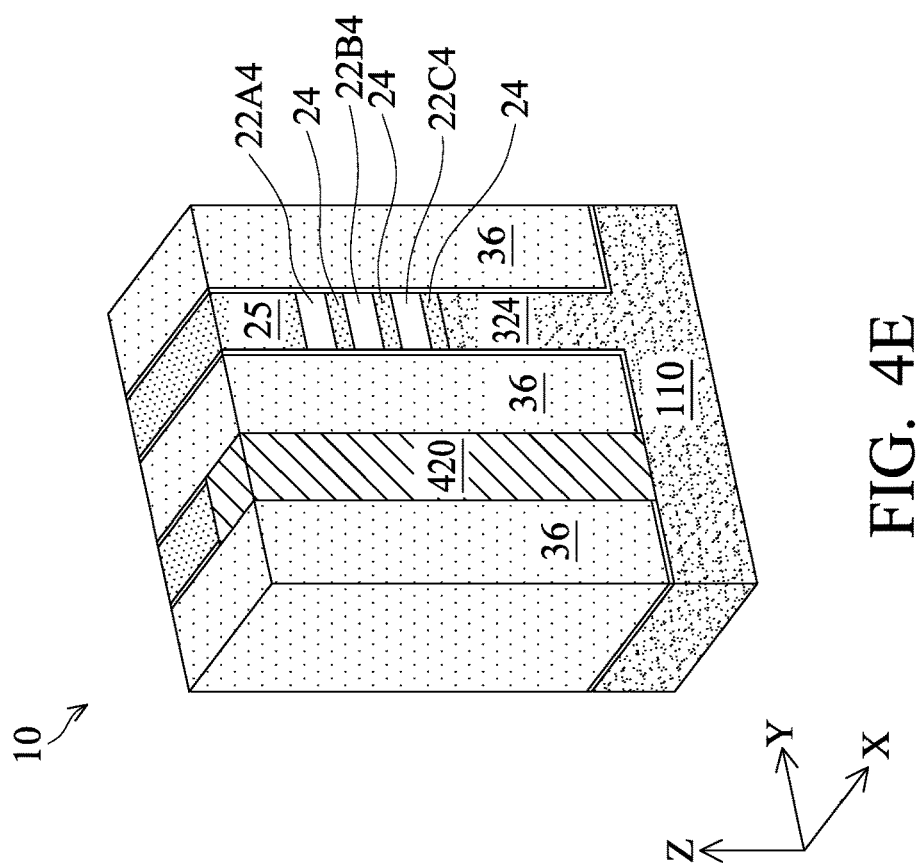
FIG. 4E is a view of forming a fin isolation structure in accordance with various embodiments.

In FIG. 4E, following removal of the fin 323 and the overlying nanostructures 22A3-22C3, 24, 25 exposed by the opening 450, the fin isolation structure 420 is formed in the second opening 470 by one or more deposition processes, such as a CVD, an ALE, or the like. The deposition process may deposit a dielectric material different from the insulation material 36. In some embodiments, the dielectric material deposited to form the fin isolation structure 420 is a low-k dielectric material, such as SiOCN or other suitable dielectric material.

Following formation of the fin isolation structure 420, the insulation material 36 may be exposed by removing the masking layer 410, as well as excess material of the fin isolation structure 420 over the insulation material 36. The hard mask layer 29 and the oxide layer 28 are also removed, and the insulation material 36 is recessed, resulting in the structure shown in FIG. 4E. Removal of the structure overlying the nanostructure 25 may include one or more suitable removal processes, such as one or more etching processes, a CMP, a combination thereof or the like. In some embodiments, a single CMP operation is performed that removes the masking layer 410, the excess material of the fin isolation structure 420, the hard mask layer 29, the oxide layer 28 and part of the insulation material 36, and terminates on the nanostructure 25.

In FIG. 4F, following exposure and recessing of the insulation material 36, the insulation material 36 is recessed to form the isolation structures 361-365, of which the isolation structures 363-365 are shown in the figure. After recessing, the nanostructures 22, 24 and upper portions of the fins 321-324 may protrude from between neighboring isolation structures 361-365. For example, the upper portion of the fin 324 is shown protruding from between the isolation structures 364, 365 in FIG. 4F. The isolation structures 361-365 may have top surfaces that are flat as illustrated, convex, concave, or a combination thereof. In some embodiments, the isolation structures 361-365 are recessed by an acceptable etching process, such as an oxide removal using, for example, dilute hydrofluoric acid (dHF), which is selective to the insulation material and leaves the fins 321-324 and the nanostructures 22, 24 substantially unaltered. In some embodiments, the fin isolation structure 420 has substantially the same width in the Y-axis direction as the fin 323.

Figure 6:
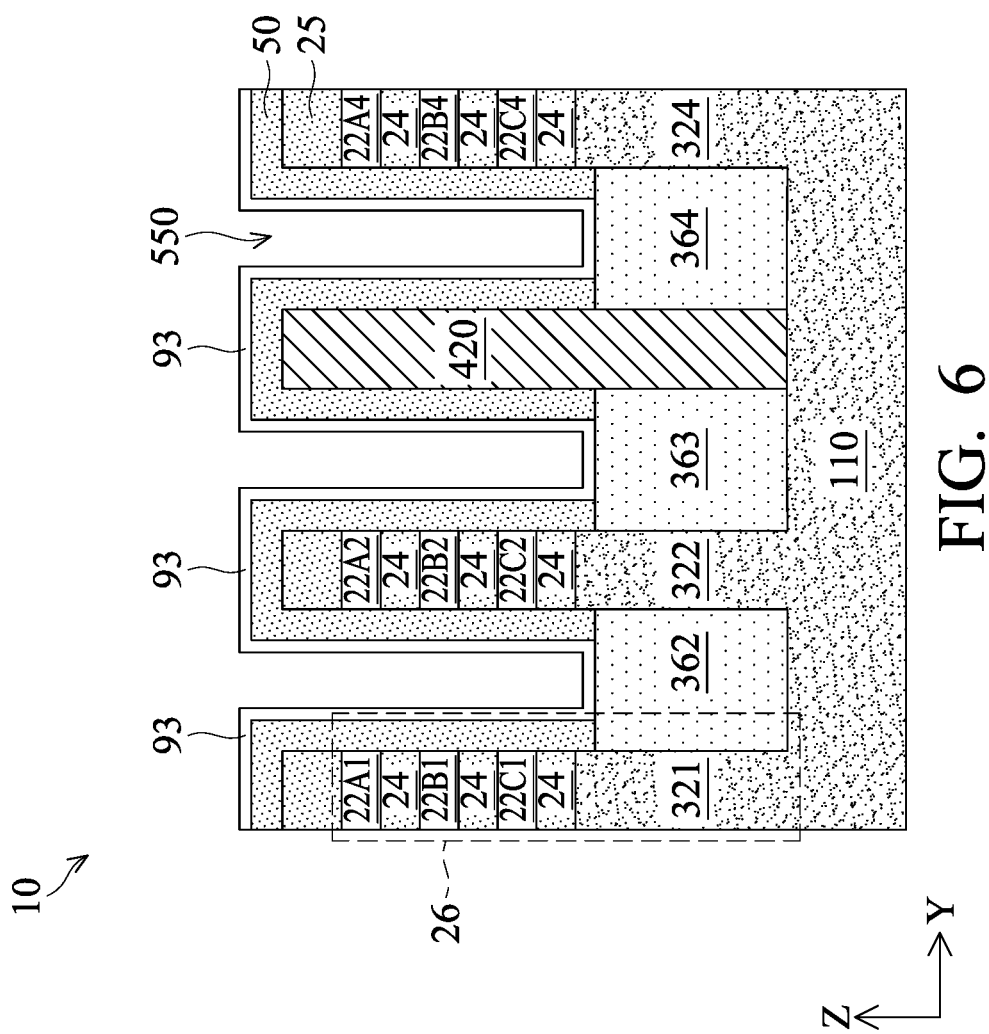
Figure 7:
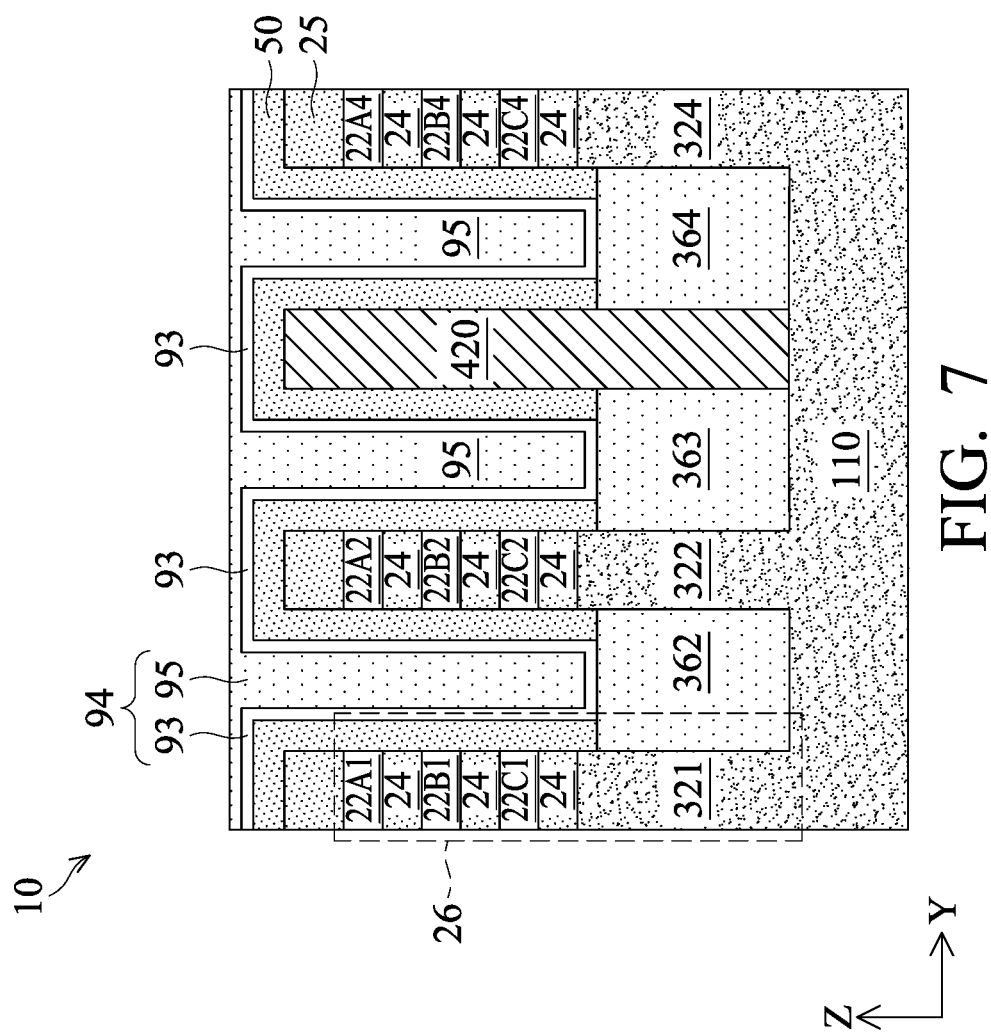
Figure 8:
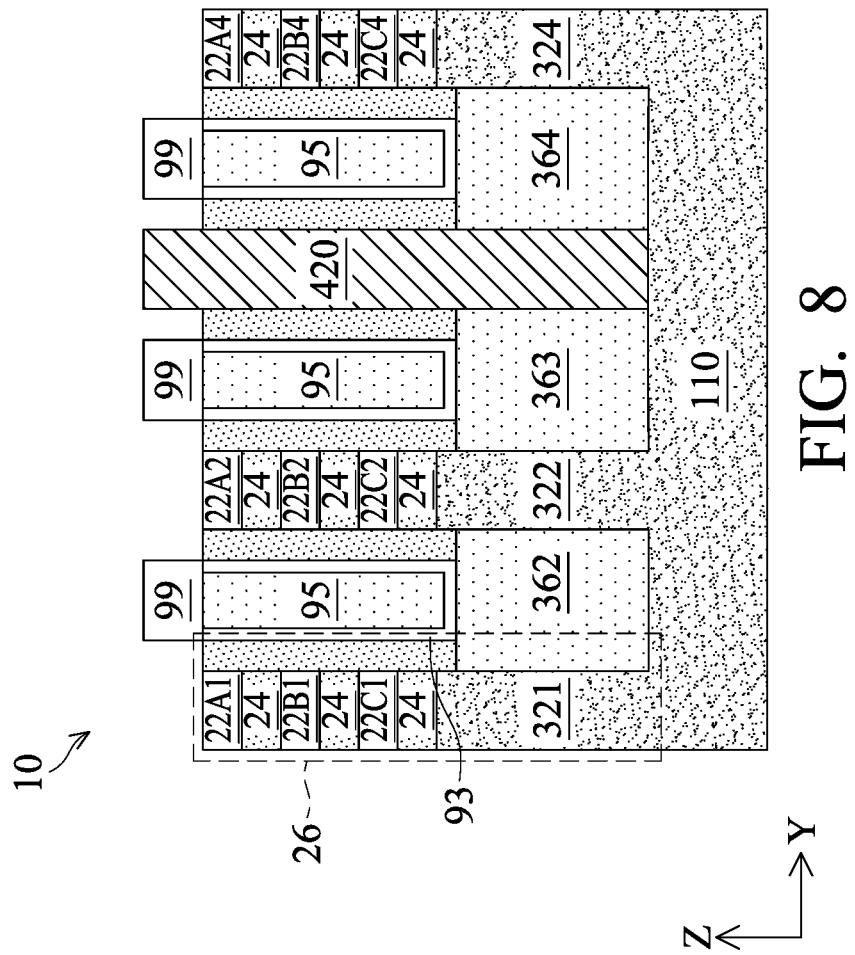

In FIGS. 5-8, inactive fin structures 94, including liner layers 90 and fill layers 95, are formed by one or more fabrication operations, corresponding to operation 1800 of FIG. 15A. FIG. 8 further illustrates formation of gate isolation structures 99 over the inactive fin structures 94.

Figure 5:
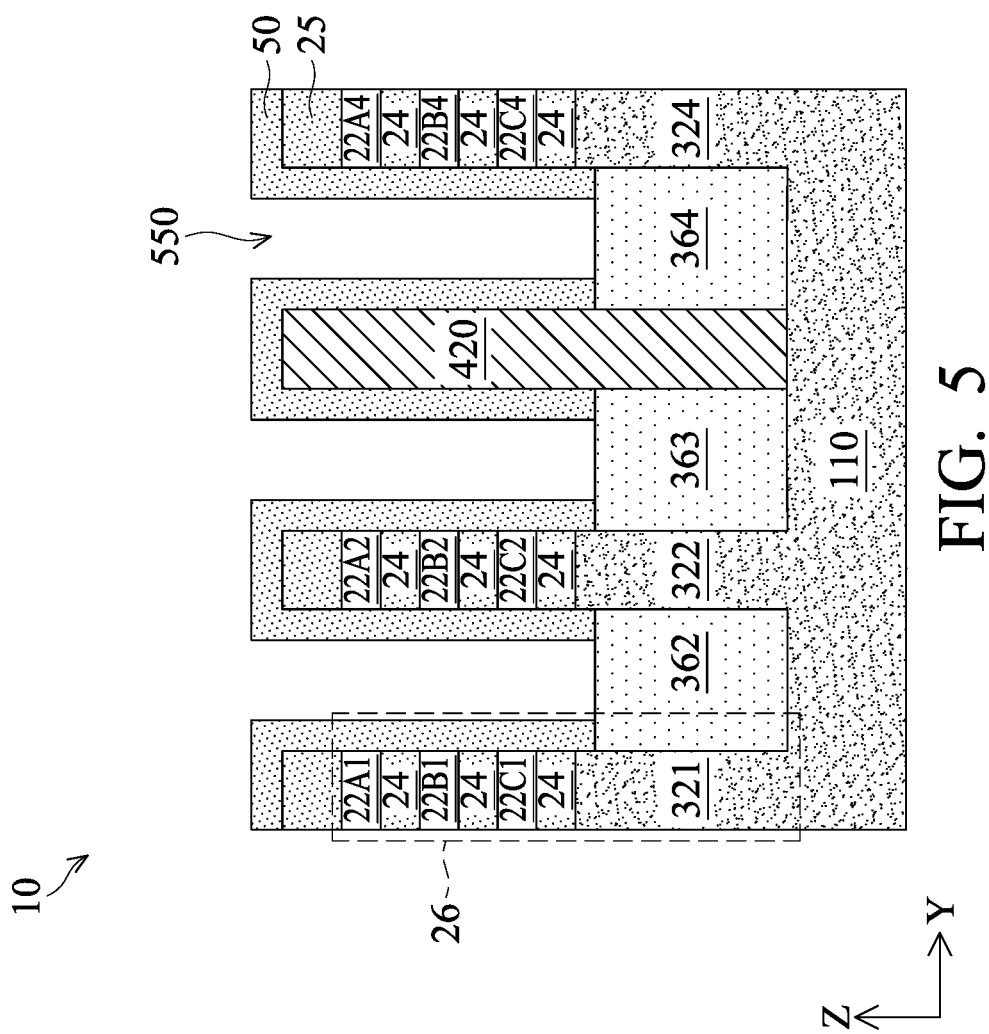
FIGS. 5-8 are view of forming inactive fins in accordance with various embodiments.

In FIG. 5, in accordance with various embodiments, a cladding layer 50 is formed on sidewalls of the fins 321-324 and the nanostructures 22, 24, 25. The cladding layer 50 may be, for example, a SiGe layer formed conformally on the mentioned features. Following formation of the cladding layer 50, an etching process may be performed to remove horizontal portions of the cladding layer 50 overlying the isolation structures 361-364. As such, the cladding layer 50 may have outer sidewalls that are in contact with the nanostructures 25, the nanostructures 22A1-22C4, the nanostructures 24, the fins 321-324, and the fin isolation structure 420. Upper surfaces of the isolation structures 362-364 may be partially exposed by openings 550 following etching of the cladding layer 50.

In FIG. 6, following formation of the cladding layer 50, the liner layer 93 may be formed on the cladding layer 50 and the isolation structures 362-364 using, for example, a self-aligning process. The liner layer 93 may be formed using an appropriate deposition process, such as CVD, ALD or the like. In some embodiments, the liner layer 93 is formed by depositing a low-k dielectric material, such as SiO, SiN, SiC, SiON, SiOC, SiCN, SiOCN, or the like. Following formation of the liner layer 93, the liner layer 93 may have outer sidewalls that are in contact with inner sidewalls of the cladding layer 50, and a lower surface that is in contact with the isolation structures 362-364, as shown. Formation of the liner layer 93 may not completely fill the openings 550, as shown.

In FIG. 7, following formation of the liner layer 93, the fill layer 95 is formed over the liner layer 93. The fill layer 95 may be formed by one or more deposition processes, such as a CVD, ALD, or other suitable deposition process. In some embodiments, the fill layer 95 is or comprises similar material to the isolation structures 362-364, such as silicon oxide. In some embodiments, the fill layer 95 is formed by depositing a low-k dielectric material, such as SiO, SiN, SiC, SiON, SiOC, SiCN, SiOCN, or the like. The fill layer 95 may substantially completely fill the remaining portion of the openings 550 not filled by the liner layer 93. In some embodiments, the fill layer 95 is substantially free of voids. Following formation of the cladding layer 50, the liner layer 93 and the fill layer 95, excess material of each of the layers may be present overlying the upper surfaces of the nanostructures 25 and the fin isolation structures 420.

In FIG. 8, gate isolation structures 99 are formed overlying the inactive fin structures 94. In some embodiments, a first planarization operation, such as a CMP, is performed to expose upper surfaces of the nanostructures 25 by removing the excess material of the fill layer 95, the liner layer 93 and the cladding layer 50 overlying the nanostructures 25 (see FIG. 7).

Following exposing the nanostructures 25, the liner layer 93 and the fill layer 95 may be recessed to a depth substantially equal to the interface between the nanostructures 25 and the uppermost nanostructures 22A1, 22A2, 22A4. In some embodiments, the recessing is performed with the cladding layer 50 in place over the fin isolation structure 420, such that the fin isolation structure 420 is protected from etchants used to etch the liner layer 93 and/or the fill layer 95. In some embodiments, if etch selectivity between the fin isolation structure 420 is sufficiently different from that of the liner layer 93 and the fill layer 95, the recessing may be performed with the fin isolation structure 420 exposed, e.g., without the cladding layer 50 present over the upper surface of the fin isolation structure 420.

Following recessing of the inactive fin structures 94, the gate isolation structures 99 may be formed in a self-aligned deposition process that fills material of the gate isolation structures 99 in openings left by the recessing of the inactive fin structures 94. In some embodiments, the self-aligned deposition process includes one or more of a CVD, ALD or other suitable process. Generally, material of the gate isolation structures 99 is harder than material of the liner layer 93 and the fill layer 95 to provide physical protection of the inactive fin structures 94 in subsequent operations. In some embodiments, the material of the gate isolation structures 99 is a high-k dielectric material, such as HfO, ZrO, HfAlO, HfSiO, AlO or the like.

Following deposition of the gate isolation structures 99, the nanostructures 25 may be removed by one or more etching processes, while leaving the fin isolation structure 420 substantially intact. The resulting structure is shown in FIG. 8. Following the etching process(es), upper surfaces of the uppermost nanostructures 22A1, 22A2, 22A4 and the cladding layer 50 may be substantially coplanar, and the upper surfaces of the fin isolation structure 420 and the gate isolation structures 99 may be substantially coplanar.

Figure 9:
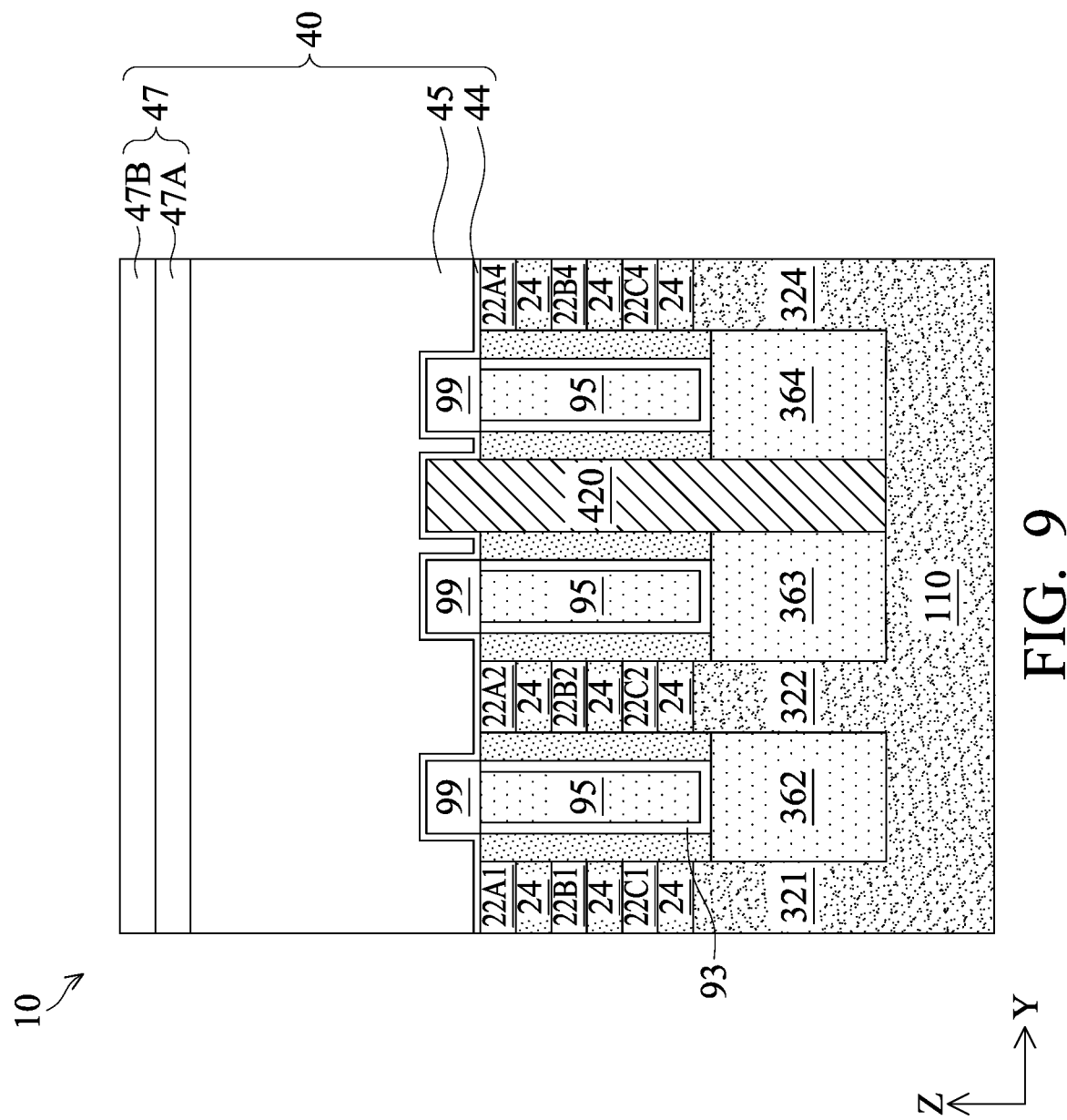
FIG. 9 is a view of forming a sacrificial gate in accordance with various embodiments.

In FIG. 9, dummy gate structures 40 are formed over the fins 321-324 and/or the nanostructures 22, 24. A dummy gate layer 45 is formed over the fins 321-324 and/or the nanostructures 22, 24. The dummy gate layer 45 may be made of materials that have a high etching selectivity versus the isolation structures 362-364. The dummy gate layer 45 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47, which may include a lower mask layer 47A and an upper mask layer 47B as shown, is formed over the dummy gate layer 45, and may include, for example, silicon nitride, silicon oxynitride, or the like. In some embodiments, a gate dielectric layer 44 is formed before the dummy gate layer 45 between the dummy gate layer 45 and the fins 321, 323, 324, the fin isolation structure 420, the nanostructures 22, 24 and the cladding layer 50.

In some embodiments, a spacer layer 41 (see FIG. 1C) is formed over sidewalls of the mask layer 47 and the dummy gate layer 45. The spacer layer 41 is made of an insulating material, such as silicon nitride, silicon oxide, silicon carbonitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channels, e.g., the channels 22A1, 22A2, 22A4, prior to forming an active gate, such as any of the gate structures 200A-200K.

Figure 10:
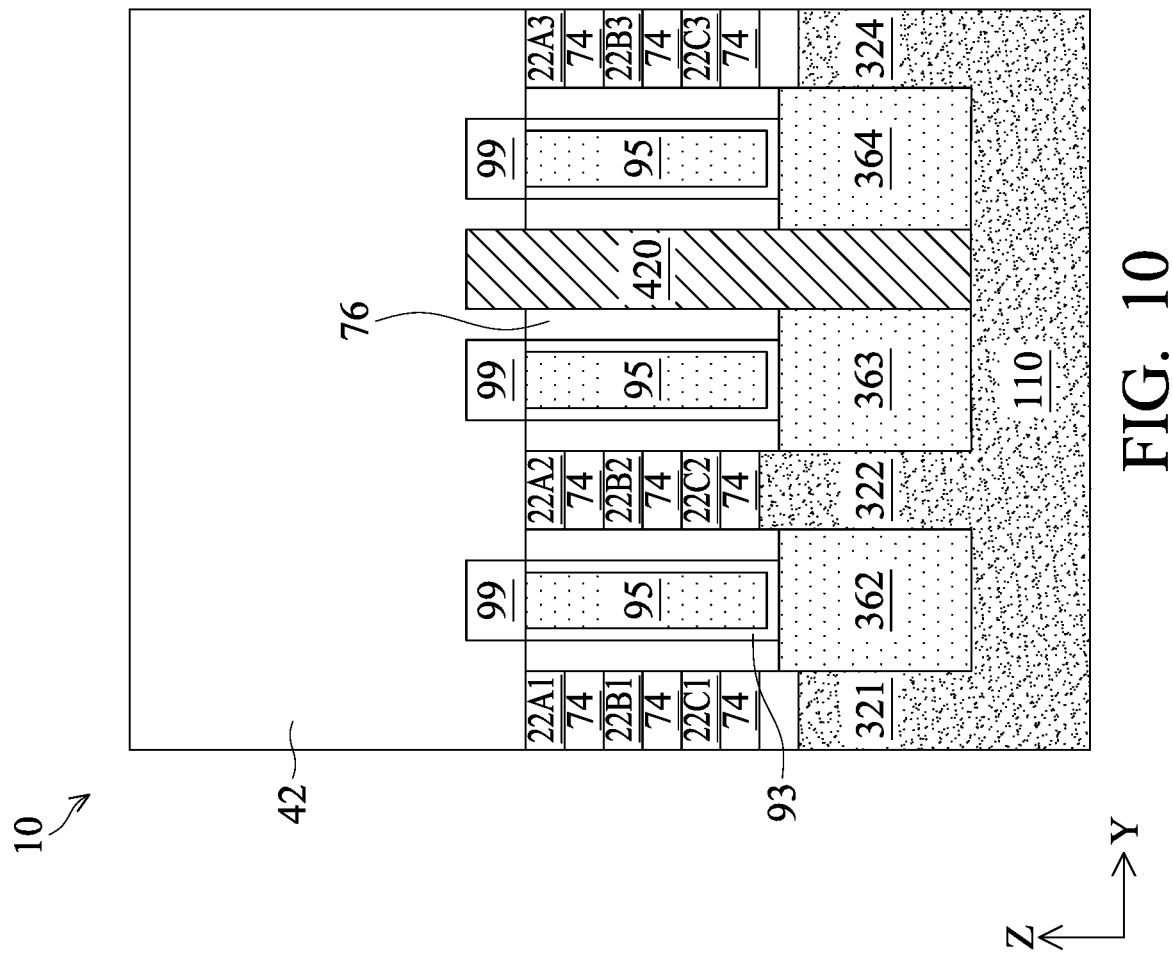
FIGS. 10 and 11 are views of forming inner spacers in accordance with various embodiments.

In FIG. 10, an etching process is performed to etch the portions of protruding fins 321-324 and/or nanostructures 22, 24 that are not covered by dummy gate structures 40, resulting in the structure shown. The recessing may be anisotropic, such that the portions of fins 321, 322, 324 directly underlying dummy gate structures 40 and the spacer layer 41 are protected, and are not etched. The top surfaces of the recessed fins 321, 322, 324 may be substantially coplanar with the top surfaces of the isolation structures 362-364, in accordance with some embodiments. The top surfaces of the recessed fins 321, 322, 324 may be lower than the top surfaces of the isolation structures 362-364, as shown in FIG. 10, in accordance with some other embodiments.

Further to FIG. 10, formation of an inner spacer layer 42 that includes inner spacers 74 and spacer portions 76 is illustrated. A selective etching process is performed to recess end portions of the nanostructures 24 (see FIG. 9) exposed by openings in the spacer layer 41 without substantially attacking the nanostructures 22. After the selective etching process, recesses are formed in the nanostructures 24 at locations where the removed end portions used to be. Next, an inner spacer layer 42 is formed to fill the recesses in the nanostructures 24 formed by the previous selective etching process. The inner spacer layer 42 may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers 42 disposed outside the recesses in the nanostructures 24. The remaining portions of the inner spacer layers (e.g., portions disposed inside the recesses in the nanostructures 24) form the inner spacers 74. Spacer portions 76 also remain following the anisotropic etching process. The resulting structure is shown in FIG. 10.

Figure 11:
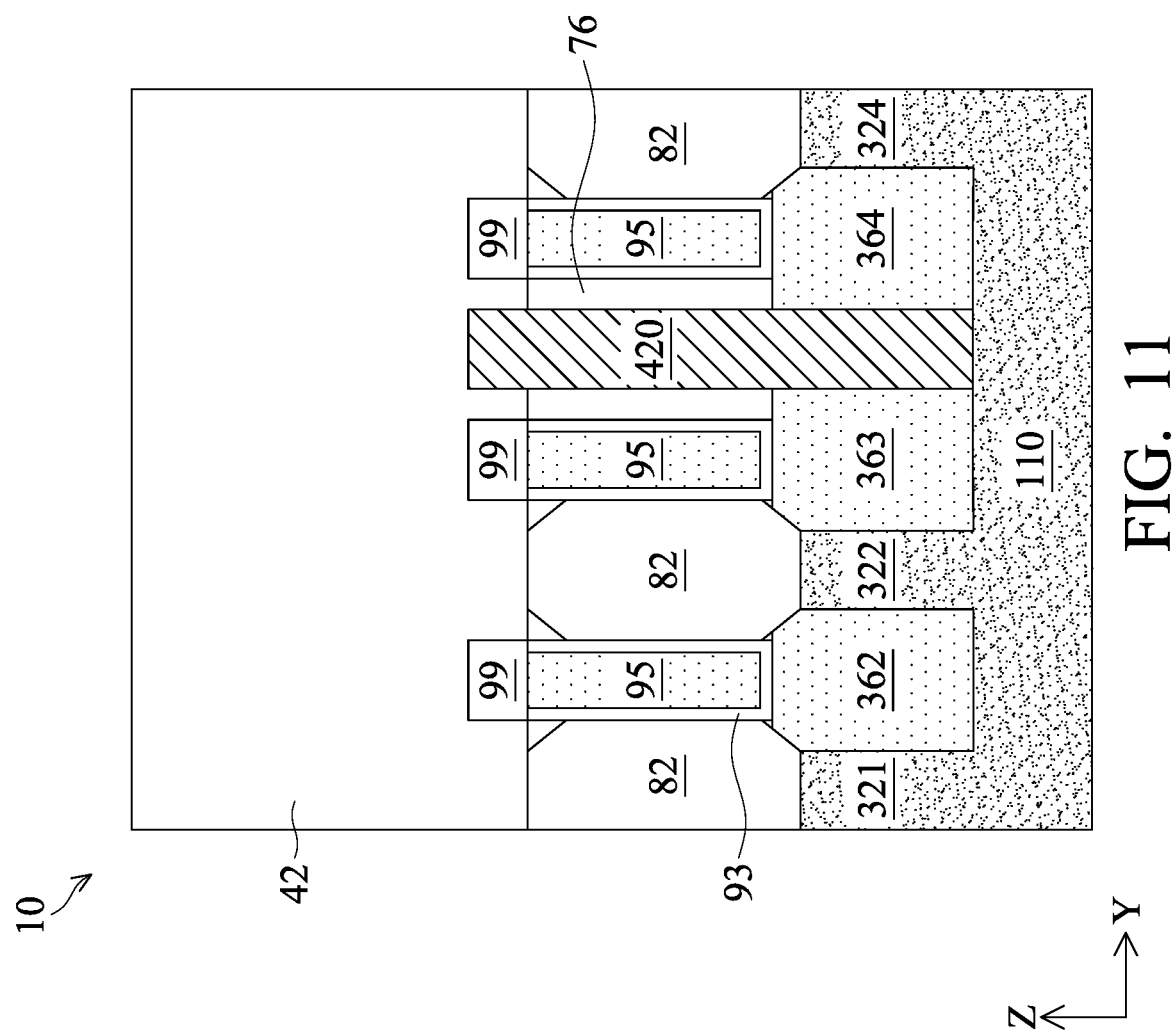

FIG. 11 illustrates formation of source/drain regions 82 corresponding to act 1200 of FIG. 15. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 321, 322, 324.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth.

Figure 12:
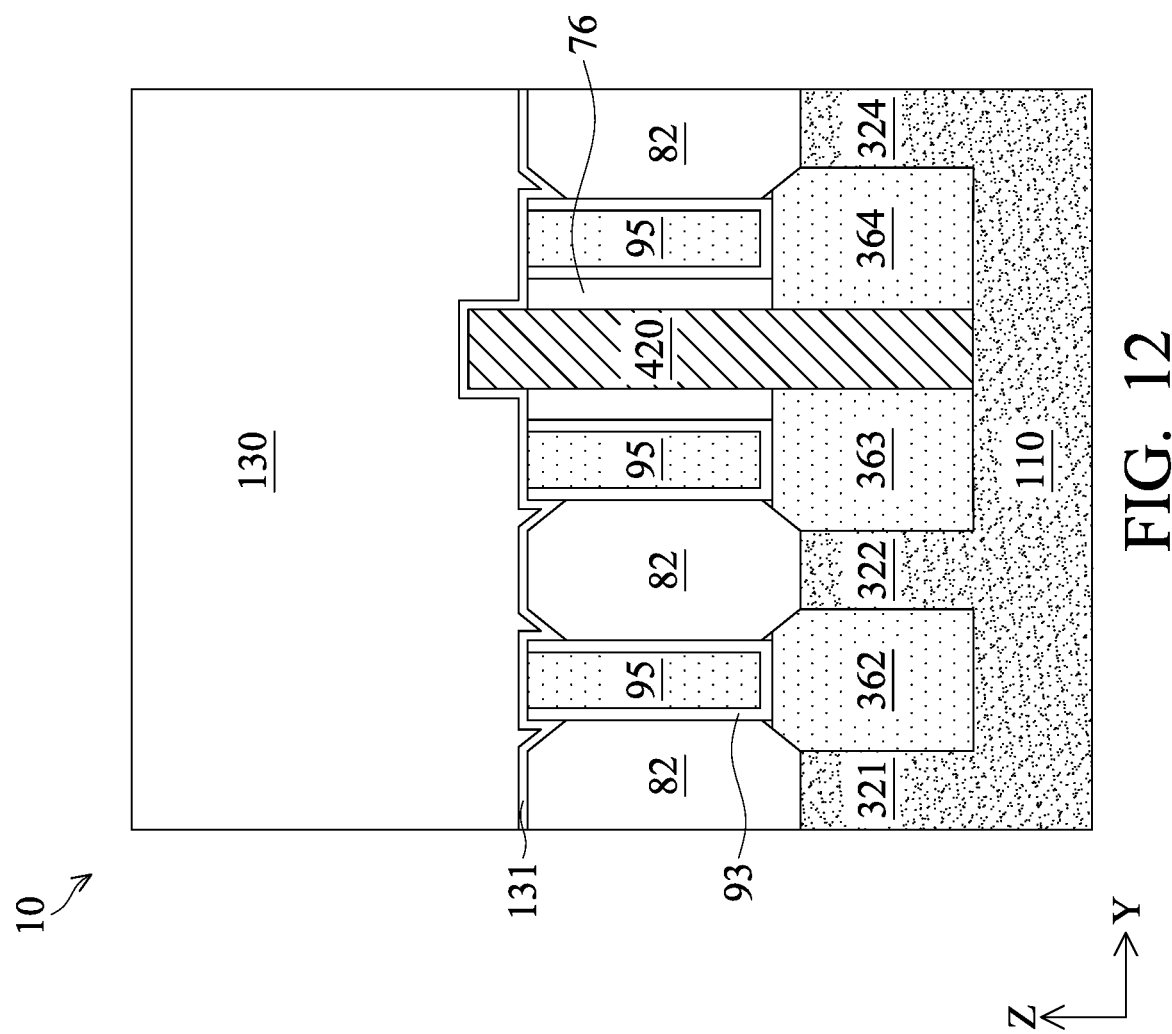
FIG. 12 is a view of forming an interlayer dielectric in accordance with various embodiments.

In FIG. 12, a contact etch stop layer (CESL) 131 and interlayer dielectric (ILD) 130 may then be formed covering the dummy gate structures 40 and the source/drain regions 82. The CESL 131 and the ILD 130 may be or include different materials of SiO, SiN, SiC, SiOCN, SiOC, SiCN, AlO, AlON, ZrSi, ZrO, ZrN, ZrAlO, LaO, HfO, HfSi, YO, TiO, TaO, TaCN, ZnO, or the like. For example, the CESL 131 may include SiN, and the ILD 130 may include SiOC.

Figure 13:
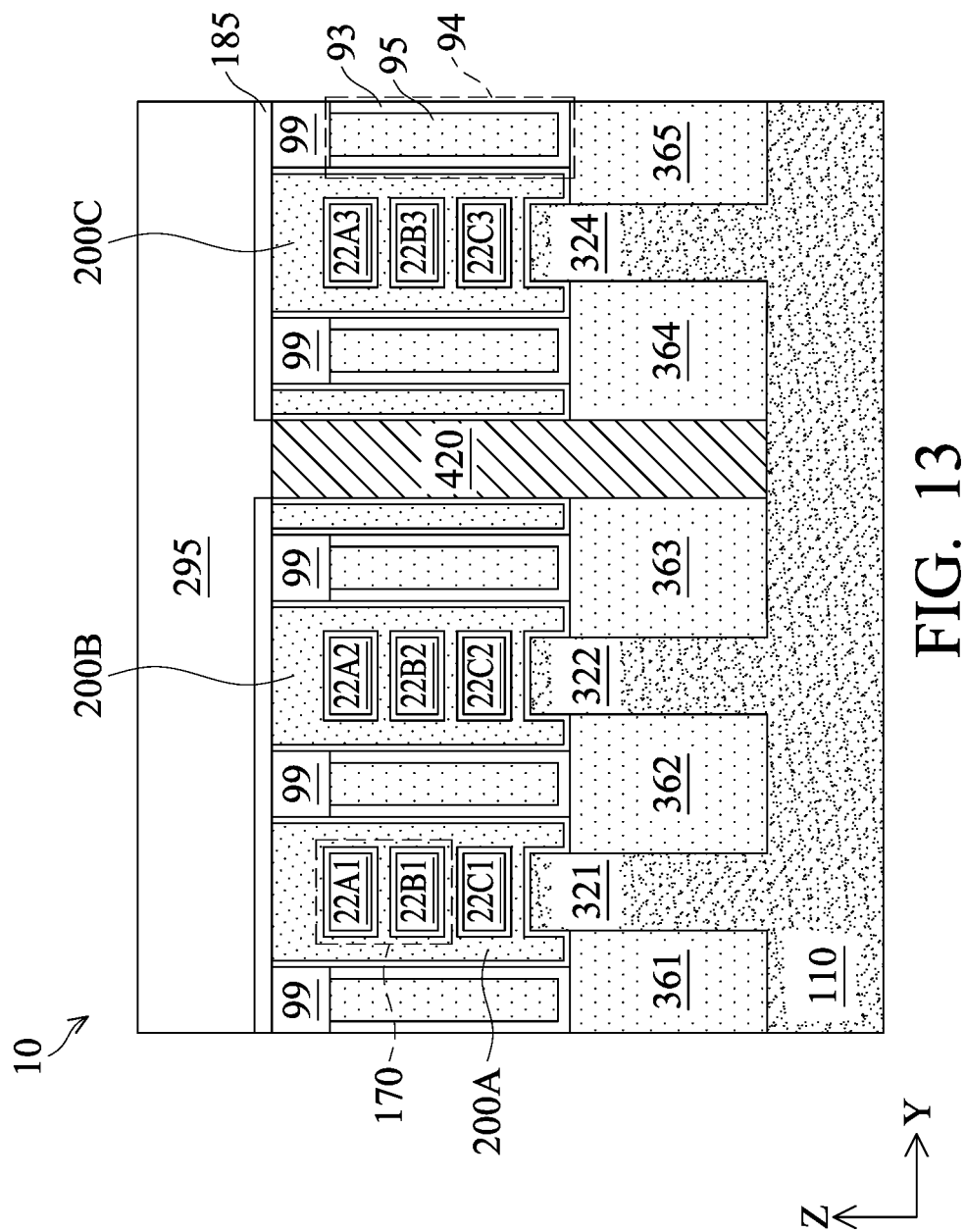
FIG. 13 is a view of forming replacement gate structures in accordance with various embodiments.

FIG. 13 illustrates formation of the gate structures 200A-200C. In some embodiments, a planarization process, such as a CMP, is performed to level the top surfaces of the dummy gate layer 45 and gate spacer layer 41. The planarization process may also remove the mask layer 47 on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 44, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20A-20K formed (only the GAA devices 20A-20C are shown in FIG. 13).

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Further to FIG. 13, replacement gates 200A-200K are formed, corresponding to act 1400 of FIG. 15. FIG. 14 is a detailed view of the region 170 of FIG. 13 corresponding to a portion of the gate structure 200A. The gate structure 200A generally includes the interfacial layer (IL, or "first IL" below) 210, at least one gate dielectric layer 600, the work function metal layer 900, and the gate fill layer 290. In some embodiments, each replacement gate 200A-200K further includes at least one of a second interfacial layer 240 or a second work function layer 700.

With reference to FIG. 14, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 14, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k>3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA devices 20A-20K.

With further reference to FIG. 14, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 14, after forming the second IL 240 and removing the high-k capping layer, the work function barrier layer 700 is optionally formed on the gate structure 200, in accordance with some embodiments. The work function barrier layer 700 is or comprises a metal nitride, such as TIN, WN, MON, TaN, or the like. In a specific embodiment, the work function barrier layer 700 is TIN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 14 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TIN, TaN, MON, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

Referring again to FIG. 13, the capping layer 295, also referred to as a "self-aligned capping" (SAC) layer, may provide protection to the underlying gate structures 200A-200K, and may also act as a CMP stop layer when planarizing the source/drain contacts 120 following formation thereof. The capping layer 295 may be a dielectric layer including a dielectric material, such as SiO2, SiN, SiCN, SiC, SiOC, SiOCN, HfO$_2$, ZrO$_2$, ZrAlOx, HfAlOx, HfSiOx, Al2O3, BN, or other suitable dielectric material. Between the capping layer 295 and the protective layer 204 is the optional hard dielectric layer. The hard dielectric layer may prevent current leakage following one or more etching operations, which may be performed to form gate contacts, source/drain contacts 120, isolation structures (e.g., source/drain contact isolation structures 150), or the like. In some embodiments, the hard dielectric layer is or comprises a dielectric material that is harder than, for example, the capping layer 295, such as aluminum oxide, or other suitable dielectric material. The hard dielectric layer may also be between the capping layer 295 and the spacer layer 41. In some embodiments, width (X direction) of the capping layer 295 is in a range of about 8 nm to about 40 nm.

Additional processing may be performed to finish fabrication of the GAA devices 20A-20K. For example, gate contacts 184 (see FIG. 1D) may be formed to electrically couple to the gate structures 200A-200E, such as the gate structure 200B. An interconnect structure may then be formed over the source/drain contacts 120 and the gate contacts 184. As depicted in FIG. 1D, the interconnect structure may include a plurality of dielectric layers 181, 185 surrounding metallic features (e.g., source/drain vias 183 and gate contacts 184), including conductive traces 182 and conductive vias 183, 184, which form electrical connection between devices on the substrate 110, such as the GAA devices 20A-20K, as well as to IC devices external to the IC device 10. In some embodiments, second capping layers (not shown) are present over the source/drain contacts 120. Configurations in which only the capping layers 295 over the gate structures 200A-200E are present (e.g., no second capping layers present over the source/drain contacts 120) may be considered "single SAC" structures, and configurations in which the capping layers 295 and the second capping layers are both present may be considered "double SAC" structures.

Embodiments may provide advantages. In nanosheet-type GAAFETs, performance of the GAA devices 20A-20K is sensitive to dimensions of the channels 22A1-22C11, which may be altered (shrunk) if damaged during removal of a neighboring fin. By forming the fin isolation structures 420 prior to recessing the isolation structures 361-365, the nanostructure channels 22A1-22C11 overlying fins adjacent the fin being removed are protected from damage by the hard mask layer 29 and the isolation structures 361-365. As such, performance of the GAA devices 20A-20K is improved.

In accordance with at least one embodiment, a device includes: a substrate; a first gate structure wrapping around a first vertical stack of nanostructure channels overlying a first fin; a second gate structure wrapping around a second vertical stack of nanostructure channels overlying a second fin; a fin isolation structure between the first gate structure and the second gate structure, extending from an upper surface of the first gate structure to an upper surface of the substrate; and a trench isolation structure between the first fin and the fin isolation structure, the trench isolation structure having different etch selectivity than the fin isolation structure.

In accordance with at least one embodiment, a device includes: a substrate; a first trench isolation structure on the substrate and extending along a first direction; a second trench isolation structure laterally separated from the first trench isolation structure in a second direction transverse the first direction; a semiconductor fin extending vertically from between the first trench isolation structure and the second trench isolation structure; and a fin isolation structure embedded in the semiconductor fin and extending vertically from the substrate to a level higher than the semiconductor fin, wherein interfaces are present between the fin isolation structure and the first and second trench isolation structures.

In accordance with at least one embodiment, a method includes: forming a multilayer lattice of alternating layers of a first semiconductor material and a second semiconductor material; forming a vertical stack of nanostructures over a semiconductor fin by forming a first opening and a second opening in the multilayer lattice; filling the first and second openings with an insulating material; exposing a portion of the semiconductor fin by forming a patterned mask; forming a third opening by removing the exposed portion of the semiconductor fin; and forming a fin isolation structure by filling the third opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first gate structure wrapping around a first vertical stack of nanostructure channels overlying a first fin;
a second gate structure wrapping around a second vertical stack of nanostructure channels overlying a second fin, the second gate structure being laterally separated from the first gate structure in a first direction;
a third vertical stack of nanostructure channels;
a fin isolation structure between the first gate structure and the second gate structure, extending from an upper surface of the first gate structure to an upper surface of the substrate, the fin isolation structure contacting the third vertical stack of nanostructures in a second direction transverse the first direction and contacting a source/drain region in the second direction; and
a trench isolation structure between the first fin and the fin isolation structure, the trench isolation structure having different etch selectivity than the fin isolation structure.

2. The device of claim 1, wherein a lower portion of the fin isolation structure is in contact with the trench isolation structure, and an upper portion of the fin isolation structure is in contact with a gate structure portion overlying the trench isolation structure.

3. The device of claim 2, further comprising an inactive fin structure between the gate structure portion and the first gate structure.

4. The device of claim 3, further comprising a gate isolation structure overlying the inactive fin structure and between the gate structure portion and the first gate structure.

5. The device of claim 1, wherein the trench isolation structure includes silicon oxide, and the fin isolation structure includes SiOCN.

6. The device of claim 1, wherein the fin isolation structure contacts a spacer layer in the first direction.

7. A device comprising:
a substrate;
a first trench isolation structure on the substrate and extending along a first direction;
a second trench isolation structure laterally separated from the first trench isolation structure in a second direction transverse the first direction;
a semiconductor fin extending vertically from between the first trench isolation structure and the second trench isolation structure;
a gate structure wrapping around a stack of nanostructures offset from the semiconductor fin in the second direction;
a gate structure portion offset from the gate structure;
a fin isolation structure embedded in the semiconductor fin and extending vertically from the substrate to a level higher than the semiconductor fin, wherein interfaces are present between the fin isolation structure and the first and second trench isolation structures and between the fin isolation structure and the gate structure portion; and
an inactive fin on the first trench isolation structure and positioned between the gate structure portion and the gate structure.

8. The device of claim 7, wherein the fin isolation structure is substantially the same width as the semiconductor fin along the second direction.

9. The device of claim 7, wherein the fin isolation structure includes a different material than the first and second trench isolation structures.

10. The device of claim 7, further comprising a second gate structure extending in the second direction and overlying the semiconductor fin.

11. The device of claim 10, further comprising a gate isolation structure embedded in the gate structure, wherein an upper surface of the fin isolation structure is substantially coplanar with an upper surface of the gate isolation structure.

12. The device of claim 7, wherein the fin isolation structure extends to a level that is below a bottom surface of the first trench isolation structure.

13. The device of claim 7, wherein the fin isolation structure extends to a level that is coplanar with a bottom surface of the first trench isolation structure.

14. A device, comprising:
a first stack of nanostructures;
a second stack of nanostructures offset from the first stack along a second direction;
a first gate structure wrapping around the first stack;
a second gate structure wrapping around the second stack;
a fin isolation structure between the first gate structure and the second gate structure and extending from a first level coplanar with an upper surface of the first gate structure to a second level coplanar with a lower surface of the first gate structure;
a first inactive fin between the first gate structure and the fin isolation structure; and
a second inactive fin between the second gate structure and the fin isolation structure.

15. The device of claim 14, further comprising:
a first gate structure portion between the first inactive fin and the fin isolation structure; and
a second gate structure portion between the second inactive fin and the fin isolation structure.

16. The device of claim 15, wherein:
a first sidewall of the fin isolation structure is in direct contact with the first gate structure portion; and
a second sidewall of the fin isolation structure is in direct contact with the second gate structure portion.

17. The device of claim 14, further comprising:
a third stack of nanostructures between the first stack and the second stack along the second direction; and
a fourth stack of nanostructures offset from the third stack along a first direction transverse the second direction;

wherein the fin isolation structure is between the third stack and the fourth stack.

18. The device of claim 17, further comprising:
a first source/drain region in contact with the third stack; and
a second source/drain region isolated from the third stack by the fin isolation structure.

19. The device of claim 18, further comprising:
a source/drain contact having a first lower surface in contact with the second source/drain region and a second lower surface in contact with the fin isolation structure.

20. The device of claim 19, further comprising:
a gate spacer on an uppermost nanostructure of the third stack;
a plurality of inner spacers between the respective nanostructures of the third stack; and
a third gate structure wrapping around the third stack, the third gate structure including:
an upper portion on the uppermost nanostructure, the upper portion being isolated from the fin isolation structure by the gate spacer; and
a lower portion between a neighboring pair of the nanostructures of the third stack, the lower portion having:
a first sidewall isolated from the first source/drain region by one of the plurality of inner spacers; and
a second sidewall in direct contact with the fin isolation structure.

* * * * *